United States Patent
Flick et al.

(10) Patent No.: US 12,237,432 B2
(45) Date of Patent: Feb. 25, 2025

(54) INDIRECT LIFTOFF MECHANISM FOR HIGH-THROUGHPUT, SINGLE-SOURCE LASER SCRIBING FOR PEROVSKITE SOLAR MODULES

(71) Applicant: The Board of Trustees of the Leland Stanford Junior University, Stanford, CA (US)

(72) Inventors: Austin Flick, Stanford, CA (US); Reinhold H. Dauskardt, Menlo Park, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 18/244,767

(22) Filed: Sep. 11, 2023

(65) Prior Publication Data

US 2024/0088314 A1    Mar. 14, 2024

Related U.S. Application Data

(60) Provisional application No. 63/405,279, filed on Sep. 9, 2022.

(51) Int. Cl.
| | |
|---|---|
| *H01L 31/0463* | (2014.01) |
| *B23K 26/06* | (2014.01) |
| *B23K 26/0622* | (2014.01) |
| *B23K 26/40* | (2014.01) |
| *H01L 31/0224* | (2006.01) |
| *H01L 31/05* | (2014.01) |
| *B23K 103/16* | (2006.01) |

(52) U.S. Cl.
CPC ...... *H01L 31/0463* (2014.12); *B23K 26/0624* (2015.10); *B23K 26/40* (2013.01); *H01L 31/022425* (2013.01); *H01L 31/0512* (2013.01); *B23K 2103/172* (2018.08)

(58) Field of Classification Search
CPC ........ H01L 31/0463; H01L 31/022425; B23K 26/0624; B23K 26/40
See application file for complete search history.

(56) References Cited

U.S. PATENT DOCUMENTS

| | | | |
|---|---|---|---|
| 5,593,901 A | 1/1997 | Oswald | |
| 8,048,706 B1 | 11/2011 | Ghandour | |
| 9,929,286 B2 * | 3/2018 | Iitsuka | ........... G02B 5/0215 |
| 2006/0088984 A1 | 4/2006 | Li | |

(Continued)

OTHER PUBLICATIONS

Rolston et al., "Rapid Open-Air Fabrication of Perovskite Solar Modules", 2020, Joule 4, 2675-2692.

(Continued)

*Primary Examiner* — Jayne L Mershon
(74) *Attorney, Agent, or Firm* — LUMEN PATENT FIRM

(57) ABSTRACT

A vertically selective liftoff scribing process is provided. One application is the fabrication of solar cells and solar modules. The basis of this technology is absorption of an indirectly focused laser beam in the front electrode material of the device, which enables removal of this layer (e.g., a P1 scribe) or removal of layers above the front electrode while leaving the front electrode intact (e.g., a P2 or P3 scribe). The laser fluence can be selected to choose between these alternatives, and further fine tuning is possible depending on details of the device structure.

10 Claims, 19 Drawing Sheets

(56) References Cited

U.S. PATENT DOCUMENTS

2019/0279905 A1* 9/2019 Sercel .............. H01L 21/67115
2020/0365462 A1* 11/2020 Iwasawa ............ B23K 26/0624

OTHER PUBLICATIONS

Flick et al., "Rapid, Scalable, Monolithically Integrated Laser Scribes for Perovskite Solar Modules", Apr. 2021, Spring MRS meeting.
Flick et al., "TCO-Based Scribing Mechanism for High-Throughput Perovskite Module Manufacturing", Dec. 2021, Fall MRS meeting.

* cited by examiner

| Scribe Method | Ref | Authors | Year | Journal | Speed (m/min) | Laser Source (Wavelength (nm)) |
|---|---|---|---|---|---|---|
| Traditional Laser Mechanisms | [22] | G. Mincuzzi...T. Brown | 2015 | ChemElectroChem | 0.12 | Nd:YAG (355, 1064), YAG (515) |
| | [33] | H. Chen...L. Han | 2017 | Nature | 1.2-4.8 | (1064, 532) |
| | [17] | E. Bi...L. Han | 2019 | Joule | 3-6 | (532, 1064) |
| | [35] | F. Giacomo...A. Di Carlo | 2020 | Micromachines | 11.7 | (355) |
| | [30] | A. Palma...A. Di Carlo | 2017 | IEEE J. Photovolt. | 18 | Nd:YVO$_4$ (355, 1064) |
| | [29] | S.J. Moon...C. Ballif | 2015 | IEEE J. Photovolt. | 36-72 | (355, 532) |
| | [36] | B. Turan...S. Haas | 2017 | Solar RRL | 54* | Nd: YVO$_4$ (355, 532, 1064) |
| TCO-Based Mechanism | [2] | N. Rolston...R.H. Dauskardt | 2020 | Joule | 14.4 | Nd:YVO$_4$ Fiber (1064) |
| | --- | This Work | 2022 | --- | 180 | Nd:YVO$_4$ Fiber (1064) |

FIG. 7

Electrical Performances of Direct $CO_2$ and Indirect Fiber P2 Scribes

| | Scribe Width [μm] | Contact Resistance [ohm cm] | Contact Resistivity [ohm mm²] | Open-Circuit Voltage, per cell [V] | Short-Circuit Current Density [mA/cm²] | Fill Factor [%] | Active Area Efficiency [%] |
|---|---|---|---|---|---|---|---|
| Control Devices | -- | -- | -- | 1.05 ± 0.01 | 20.05 ± 0.44 | 70.81 ± 2.20 | 15.03 ± 0.47 |
| Direct $CO_2$ P2 | 142 ± 8 | 0.50 ± 0.08 | 0.71 ± 0.12 | 1.02 ± 0.01 | 18.14 ± 0.92 | 54.58 ± 2.22 | 10.17 ± 0.66 |
| Indirect Fiber P2 | 99 ± 5 | 0.32 ± 0.1 | 0.32 ± 0.09 | 1.05 ± 0.00 | 20.18 ± 0.20 | 69.22 ± 1.66 | 15.09 ± 0.61 |

FIG. 8

Statistics for 4-Cell All Indirect Fiber Laser-Scribed Perovskite Modules

|  | Active Area [cm$^2$] (per cell) | Open-Circuit Voltage [V] (per cell) | Short-Circuit Current Density [mA/cm$^2$] | Fill Factor [%] | Active Area Efficiency [%] |
| --- | --- | --- | --- | --- | --- |
| Devices | 0.21 | 1.01 ± 0.02 | 20.84 ± 0.52 | 73.6 ± 2.7 | 15.52 ± 0.66 |
| 4-Cell Modules | 0.88 (0.22) | 4.08 ± 0.06 (1.02 ± 0.02) | 21.27 ± 0.75 | 72.6 ± 3.2 | 15.66 ± 0.53 |

FIG. 9

| Scribe | Power (W) | Predicted Scribe Width (µm) | Actual Scribe Width (µm) | Relative Error (%) |
|---|---|---|---|---|
| P1 | 30 | 37 | 39.1 | 5.4 |
| P1 | 35 | 44 | 45.5 | 3.3 |
| P1 | 37 | 48 | 49.8 | 3.6 |
| | | | | |
| P2 (Perovskite) | 19.5 | 60 | 59.5 | -0.8 |
| P2 (Perovskite) | 20.5 | 61 | 61.9 | 1.5 |
| | | | | |
| P2 (NiO$_x$) | 19.5 | 23 | 23.8 | 3.4 |
| P2 (NiO$_x$) | 20.5 | 27 | 26.2 | -3.1 |

FIG. 10

INDIRECT LIFTOFF MECHANISM FOR HIGH-THROUGHPUT, SINGLE-SOURCE LASER SCRIBING FOR PEROVSKITE SOLAR MODULES

CROSS REFERENCE TO RELATED APPLICATIONS

This application claims the benefit of U.S. provisional patent application 63/405,279, filed on Sep. 9, 2022, and hereby incorporated by reference in its entirety.

GOVERNMENT SPONSORSHIP

This invention was made with Government support under contract DE-EE0008559 awarded by the Department of Energy. The Government has certain rights in the invention.

FIELD OF THE INVENTION

This invention relates to laser scribing of optoelectronic or electronic devices.

BACKGROUND

Monolithic integration of serially interconnected solar cells can be achieved using patterned deposition methods such as masked depositions and printing of individual cells or by forming individual cells from blanket films using mechanical and/or laser-based scribing procedures. Progress towards achieving cells with minimal power losses have focused primarily on laser-based scribing methods.

Laser scribing processes have included fiber lasers, $CO_2$ lasers, diode-pumped solid-state (DPSS) lasers, and excimer lasers. Variable wavelengths, fluences, pulse durations, and frequencies enable a variety of procedures for achieving the standard serially interconnected module architecture involving three unique scribes, namely, the P1, P2, and P3 as described in detail below.

While the wide variety of laser processing conditions enables the optimization of many scribing procedures, standard processes for achieving high-performing scribed module interconnections have yet to be developed. Furthermore, a frequent need for multiple unique laser sources increases manufacturing costs and complexity, and the lack of consistency of laser type, wavelength, power, speed, and pulse duration has hindered efforts towards improved scalability and module performance, while dependence on selective laser absorption in selected cell layers for the different scribes can result in thermal damage to the cell. Accordingly, it would be an advance in the art to provide improved laser scribing, especially for solar cells.

SUMMARY

This work dramatically improves the process simplicity to produce, for example, perovskite solar modules while reducing manufacturing costs and improving device stability. The TCO (transparent conductive oxide) sourced vertically selective lift-off mechanism enables the use of an identical infrared laser source for the performance of all three scribes (P1, P2, and P3) in a serially interconnected perovskite thin-film solar module. The resulting scribes improve the electrical performance of the series interconnections and avoid residual thermal damage caused by conventional scribing mechanisms that focus the ablative energy on the perovskite layer. Elimination of residual thermal damage by the scribing procedure allows for the employment of long pulse-duration laser systems in the ns to µs range, reducing the capital equipment costs for perovskite module production.

This vertically selective scribing method can be easily tuned to a variety of substrate, transparent conducting oxide, and transport layer materials. The ablation behavior and scribe width is tunable, and the scribes enable low-contact resistance interconnections and eliminate residual thermal damage for high-performing perovskite modules.

One application example is for optoelectronic devices having two compositions. The first composition can encompass one or more active materials at least capable of emitting or absorbing light (composition 1), which is deposited onto a transparent electrode (composition 2) on a transparent substrate. Composition 1 can be a semiconducting photovoltaic material with a bandgap between 1.48 and 1.62 eV, while composition 2 can be a transparent conducting oxide (TCO) material with an optical bandgap between 3.5 and 4.3 eV.

In one example, a pulsed infrared laser is focused through the transparent substrate onto the surface of the TCO electrode of composition 2. Absorption of the infrared laser within the TCO material promotes the ablation and removal of the TCO material of composition 2, forming a scribe denoted as P1. Ablation of the TCO material also lifts off any overlying layers such as those of composition 1. Reduced fluence of the infrared laser reduces the ablation and lift-off behavior of compositions 2 and 1, respectively, until the provided laser fluence is below the threshold for ablation and removal of the TCO material of composition 2 while creating an ablation impulse in the TCO still capable of promoting lift-off of the overlying layers of composition 1.

Here, a perovskite is defined as a material with a chemical formula $ABX_3$ where A is a monovalent cation, B is a divalent metal cation, and X is a monovalent (typically halide) anion. All three components (i.e., A, B, or X) can comprise either a homogeneous or heterogeneous mixture of elements and molecules (e.g., A can be some composition of methylammonium (CH3NH3+), formamidinium (CH3(NH2)2+), Cs+, etc., B some composition Pb2+, Sn2+, Ge2+, and/or other divalent metal cations, and X is typically some composition of Cl—, Br—, I—, BF4-, PF6-, SCN—, etc.). One example of a perovskite molecular formula would be $CH_3NH_3PbI_3$ while another would be

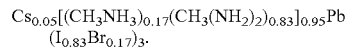

The qualities of the scribe can be readily tuned by altering the input laser parameters (power, focus, pulse frequency, pulse duration, repetition rate, etc.) to adjust the ablative response in the transparent electrode and the width of the resulting scribe. The scribing method only requires ablative interactions with the transparent conducting oxide electrode material, and the library of compatible front electrode materials includes a variety of metal oxides (ITO, FTO, AZO, etc.).

Possible Modifications:

Laser Source: In certain embodiments, the wavelength of the infrared laser is about 1064 nm, but the process can utilize wavelengths of 980 nm, 1047 nm, 1053 nm, 1060 nm, and 1080 nm. The laser may be any type of pulsed laser (i.e. Q-switched, mode-locked) and can use gain mediums including Nd:YAG and Nd:YVO4. Pulse durations may be in the range between 1 ns and 100 µs.

Scribe Geometry: The geometry may be changed to accommodate the desired device properties. The dimensions of the scribe (i.e. single scribe width, total scribe width with multiple passes) and spacing between scribes can be readily adjusted.

Transparent Electrode Materials: The TCO sourced lift-off scribing mechanism has been demonstrated with tin-doped indium oxide (ITO) and fluorine-doped tin oxide (FTO), but other transparent conducting oxides such as aluminum-doped zinc oxide (AZO) can be utilized as applications demand.

Transport Layer Materials: The scribes have been demonstrated on device stacks with a variety of transport layers deposited on top of the TCO including $NiO_x$ and $TiO_2$. Other transport layers including metal oxides (i.e. $SnO_2$, $MoO_3$) and organic materials (e.g. PTAA (poly(triarylamine)), 2PACz ([2-(9H-carbazol-9-yl)ethyl]phosphonic acid)) can be utilized.

Substrate Material: The demonstration of the TCO sourced lift-off scribes on rigid substrates (i.e. glass) is not the only possible type of substrate that can accommodate the infrared laser processing. The scribes can be performed on any substrate that lacks interactions with the infrared laser.

Laser Driving Technique: While the initial demonstration of the technique used a belt-driven gantry for the movement of the laser head and control of the scribe geometry (flatbed laser), other equipment such as galvanometers (galvo lasers) and translation stages can be used to perform the scribes.

The transparent conducting oxide sourced lift-off scribing mechanism can be employed in any thin-film electronics structure that requires removal of material deposited on a transparent conducting oxide. The primary demonstrated application for the lift-off scribing mechanism is performance of lift-off P2 and P3 scribes in perovskite solar devices as an alternative to ablative laser scribes focused on the ablation of the photoactive perovskite material. Implementation of the transparent conducting oxide sourced lift-off scribing mechanism into many other types of devices, such as organic solar cells and light-emitting diodes, is also possible.

There are several key advantages to using the TCO sourced lift-off scribing mechanism:

1) Improved Material Removal and TCO Exposure: Conventional laser scribes employ the active ablation of the perovskite active layer, carving through the device stack and leaving a considerable amount of residual material behind, including the transport layer between the TCO and perovskite. However, when using the TCO sourced lift-off mechanism, the ablative response is formed directly at the interface between the TCO and transport layer, resulting in less residual perovskite material and greater exposure of the underlying TCO within the scribe.

2) Reduced Thermal Damage to Perovskite Layer: Conventional ablative scribing mechanisms employ direct stimulation of the perovskite photoactive layer with the laser fluence, relying on intense thermal damage to promote material removal, resulting in residual thermal damage on the boundaries of the scribe. The TCO sourced lift-off scribes eliminate the residual thermal damage by focusing the entire ablative energy on the TCO for each scribe.

3) Reduced Contact Resistance: Greater exposure of the TCO electrode within the scribe, with reduced residual perovskite and transport layer material, alongside reduced thermal damage to the scribe, promotes greater contact between the TCO and post-scribe deposited top electrode within the P2 scribe, in one example reducing the contact resistance by 40% from 0.5 ohm*cm with the conventional ablative scribing mechanism to 0.3 ohm*cm with the TCO sourced lift-off scribing mechanism. The reduced contact resistance results in higher performing perovskite modules compared to the ablative P2 scribed modules, as described below.

4) Long-Pulse Duration Laser Systems: Conventional ablative mechanisms require short pulse-duration laser systems (ps to fs) to mitigate the residual thermal damage of these scribes. The TCO sourced lift-off scribes eliminate the residual thermal damage, allowing for the implementation of lower cost, long pulse-duration laser systems (ns to µs).

BRIEF DESCRIPTION OF THE DRAWINGS

FIG. 7 is a table showing previous scribing methods.

FIG. 8 is a table showing electrical performance comparison between direct $CO_2$ and indirect fiber P2 scribes.

FIG. 9 is a table showing statistics for the 4-cell all indirect fiber laser-scribed module performance metrics compared to control devices.

FIG. 10 is a table showing a comparison of actual and predicted scribe widths for various P1 and P2 scribes.

DETAILED DESCRIPTION

Figure 1A:
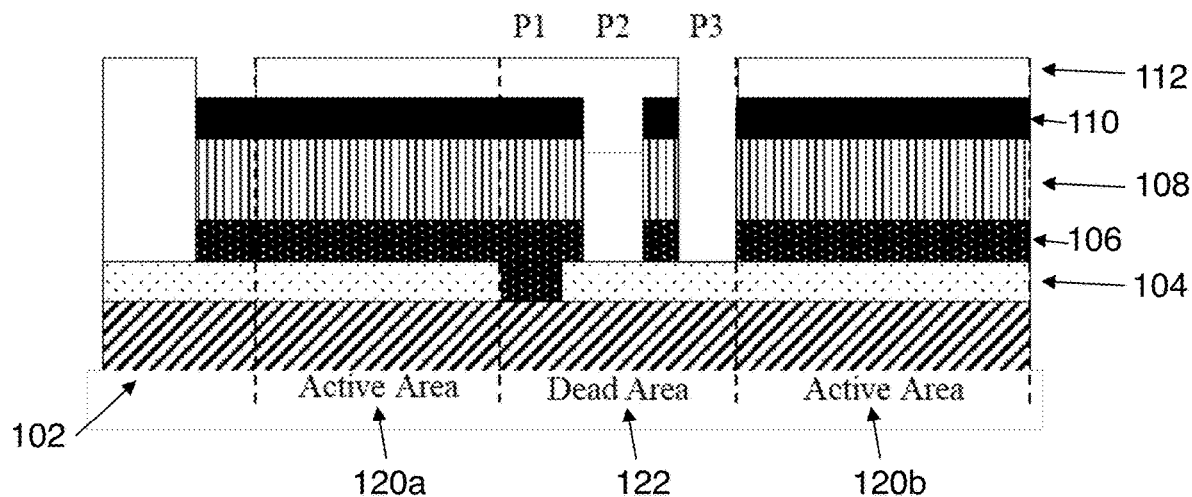
FIG. 1A schematically shows the structure of P1, P2 and P3 scribes.

Section A describes general principles relating to embodiments of the invention. Section B describes a detailed experimental investigation of principles relating to embodiments of the invention.

A) General Principles

An exemplary embodiment of the invention is a method for scribing an electrical or optoelectronic device, the method comprising:

1) depositing a transparent conductive oxide (TCO) layer on a transparent substrate;

2) depositing one or more active device layers on top of the TCO layer to make a multilayer stack; and 3) lifting off at least one layer of the multilayer stack in a liftoff pattern with a vertically selective liftoff.

Here the liftoff pattern is defined by passing a laser beam through the substrate to be absorbed in the TCO layer and scanning a position of the laser beam such that material at or above illuminated parts of the TCO layer is lifted off. The vertically selective liftoff entails removal of a selected layer of the multilayer stack and all layers in the multilayer stack above the selected layer, and the selected layer of the multilayer stack is determined by one or more processing parameters of the vertically selective liftoff. For example, laser fluence may be used to determine the selected layer, in sharp contrast to the conventional use of laser wavelength to determine which layers are removed in a scribe.

The fluence of the laser beam in operation can be between 0.2 and 1.5 J/mm$^2$ with a pulse duration between 0.1 and 500 μs.

The TCO layer in the liftoff pattern can remain intact after the vertically selective liftoff (e.g., P2 and P3 scribes as described below). Alternatively, the TCO layer can be removed (e.g., as in the P1 scribe described below).

The multilayer stack can includes two or more active device layers, where the selected layer of the multilayer stack is one of the two or more active device layers in the multilayer stack. See FIG. 6A and section B2.1 for further details on this point.

A laser source for the laser beam can be a fixed-wavelength fiber laser.

The scanning speed of the laser beam is preferably at least 100 m/minute.

Practice of the invention does not depend critically on the TCO composition. Suitable TCOs include, but are not limited to: indium tin oxide, fluorine-doped tin oxide, aluminum-doped zinc oxide, and transparent oxides that absorb at 1064 nm.

Practice of the invention also does not depend critically on the composition of the active layer(s). Exemplary active layers include, but are not limited to: dense metal oxides, polymer layers, organic layers, perovskites, hybrid organic-inorganic perovskites, and metal layers. Any active layer can be crystalline or amorphous, and a multi-layer stack of active layers can have any combination of crystalline and amorphous layers in it, subject to fabrication limits resulting from the deposition method(s) employed. Typical active layer thicknesses are between 10 nm and 1000 nm.

B) Detailed Examples

B1) Introduction

The performance improvements of hybrid organometallic lead-halide perovskite solar cells combined with low-cost and high-throughput solution processing enables perovskite modules to compete with state-of-the-art silicon solar technology while reducing equipment and manufacturing costs. Open-air, scalable deposition methods such as slot-die, blade, and spray coating have particular cost and throughput advantages over vacuum-based deposition. For monolithically integrated module designs involving serially interconnected perovskite solar cells, scalable, high-throughput, and low-cost methods to produce electrically isolated cells with low resistivity interconnections are essential. The incorporation of serially interconnected cell designs subdivide the total device area into multiple sub-cells connected in series, reducing the overall current output and shortening the length of current travel through the front electrode, thus reducing resistive power losses across the entire device.

The monolithic integration of serially interconnected cells can be achieved using patterned deposition methods such as masked depositions and printing of individual cells or by forming individual cells from blanket films using mechanical and/or laser-based scribing procedures. Progress towards achieving cells with minimal power losses have focused primarily on laser-based scribing methods, providing superior interconnection alignment and fidelity over masked and printed designs for optimally efficient use of the substrate towards power conversion while demonstrating superior electronic properties over their mechanical alternative.

Figure 1B:
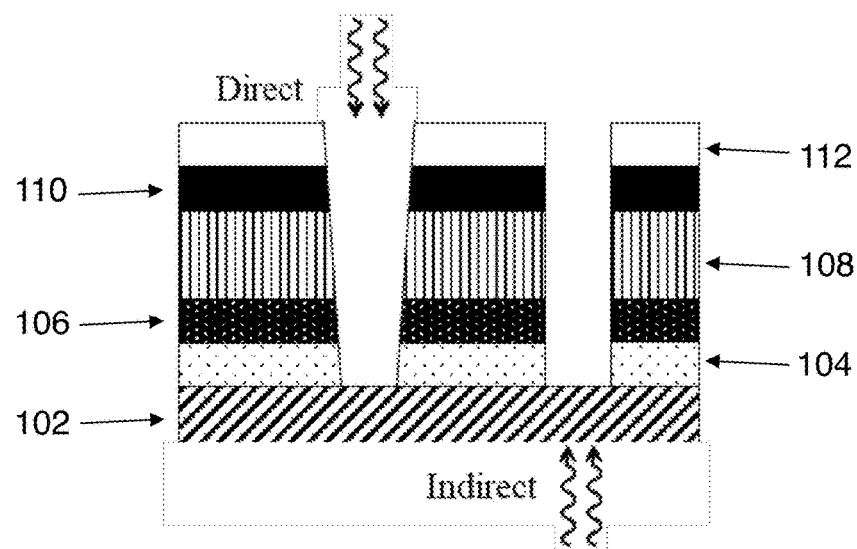
FIG. 1B shows the difference between direct and indirect focusing of a scribe.

FIG. 1A schematically shows P1-P2-P3 scribes in a configuration with two active cells connected in series via monolithically integrated scribes. In this example, 102 is a transparent substrate (e.g., glass), 104 is a transparent conductive oxide front electrode (e.g., ITO), 106 is a first transport layer for a solar cell, 108 is a perovskite solar cell active material, 110 is a second transport layer for the solar cell, and 112 is the rear electrode (e.g., silver). The two active cells are referenced as 120a and 120b. The dead space caused by the scribes is referenced as 122. FIG. 1B shows direct and indirect focusing for laser scribing.

Figure 1C:
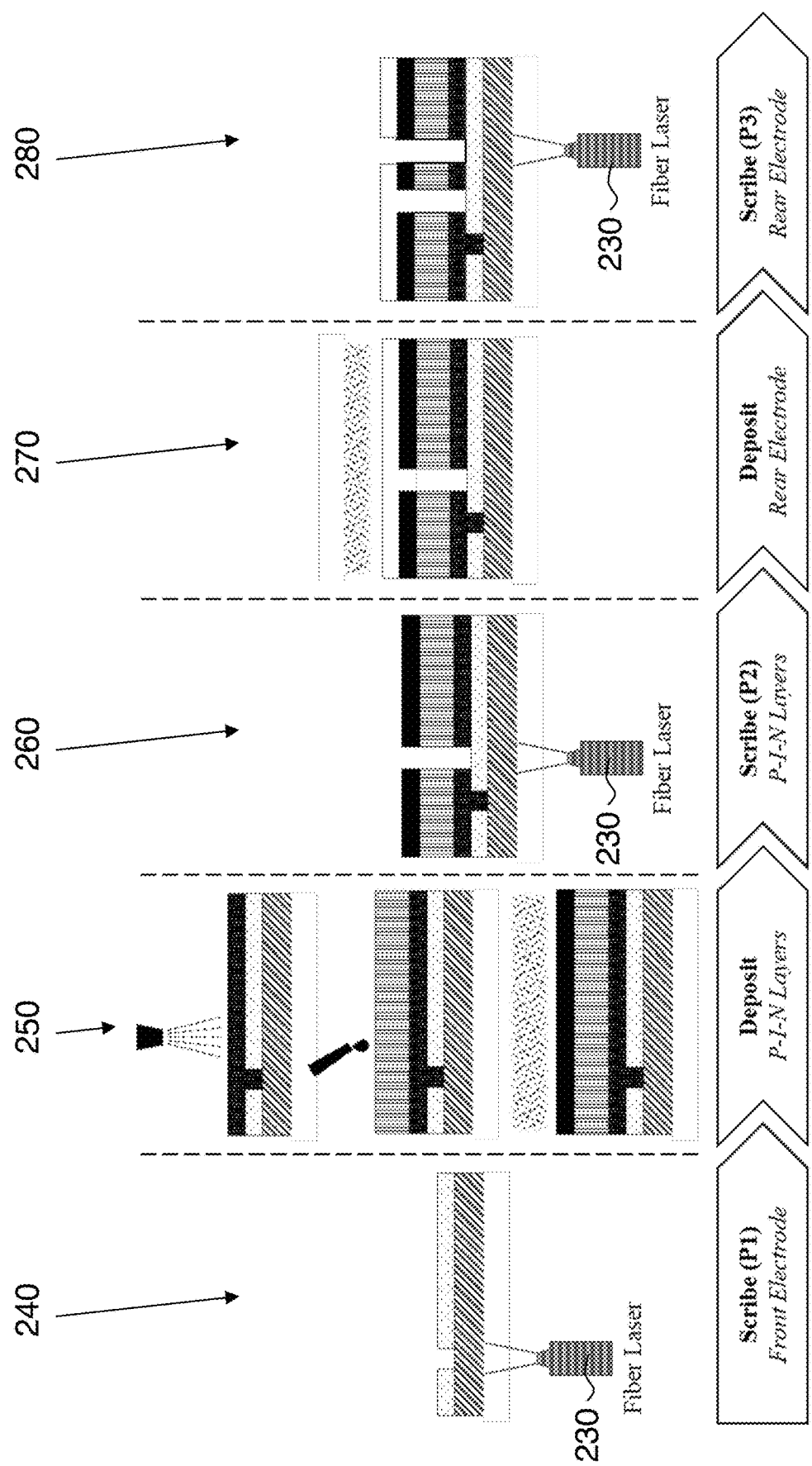
FIG. 1C schematically shows a process flow including P1, P2 and P3 scribes.

FIG. 1C shows an exemplary module process flow illustrating laser scribe incorporation. Here 230 is the fixed-wavelength laser that performs the three distinct scribes (e.g., a fiber laser). Step 240 is the P1 scribe that patterns the front electrode. Step 250 is deposition of the active layers (e.g., a PIN diode for a solar cell). Practice of the invention does not depend on details of the active layers, so this step is not described in detail. Step 260 is the P2 scribe that lifts off the active layers while leaving the front electrode layer intact. Step 270 is deposition of the rear electrode. Practice of the invention does not depend on details of the rear electrode, so this step is not described in detail. Step 280 is the P3 scribe that lifts off the active layers and the rear electrode while leaving the front electrode layer intact. Laser scribing processes have included fiber lasers, $CO_2$ lasers, diode-pumped solid-state (DPSS) lasers, and excimer lasers. Variable wavelengths, fluences, pulse durations, and frequencies enable a variety of procedures for achieving the standard serially interconnected module architecture involving three unique scribes, namely, the P1, P2, and P3. Each scribe serves a unique purpose in the overall function of the series interconnection as illustrated in FIG. 1A: the P1 scribe performs the electrical isolation of the front transparent conducting oxide (TCO) electrode, patterning the module design; the P2 scribe creates a pathway through the active layers, allowing the rear electrode of one cell to contact the front TCO electrode of an adjacent cell after filling with a conductive material; and lastly, the P3 scribe is used to electrically isolate the rear electrode of adjacent cells, completing the cell isolation and module design.

While the wide variety of laser processing conditions enables the optimization of many scribing procedures, standard processes for achieving high-performing scribed module interconnections have yet to be developed. Furthermore, a frequent need for multiple unique laser sources increases manufacturing costs and complexity, and the lack of consistency of laser type, wavelength, power, speed, and pulse duration has hindered efforts towards improved scalability and module performance, while dependence on selective laser absorption in selected cell layers for the different scribes can result in thermal damage to the cell. Reported laser-scribing methods for perovskite modules including their linear scribing speed and laser source are listed in the table of FIG. 7.

A low-cost, single-source indirect method involving absorption in only one cell layer to achieve all three scribes would offer an attractive pathway towards simplicity, high speed, and low cost. Here, we demonstrate a unique single-source, high-throughput and low-cost laser scribing mechanism that focuses exclusively on interactions with the front TCO electrode material for performing the P1, P2, and P3 scribes, avoiding ablation and potential heat-related damage of the perovskite layer through a liftoff mechanism analogous to many P3 scribes. The TCO-based liftoff mechanism demonstrated enables implementation across a variety of perovskite and thin-film module architectures. These scribes provide low resistance contacts, sufficient electrical isolation of the front and rear electrodes, and excellent module performance with respect to individual cells despite an increase in active areas of the overall devices. The electrode isolation, interconnection quality, and alignment are characterized as a function of laser operating conditions to optimize a P1-P2-P3 laser scribing method for superior throughput and enhanced module performance. Cost modeling containing an analysis of module throughput and comparisons to conventional laser scribing highlights the commercial benefits for scalable manufacturing.

B1.1) Laser Scribing Mechanisms

The traditional development of scribing processes for thin-film photovoltaics involved selective ablation of different layers for the demonstration of each scribe, utilizing unique laser wavelengths for each step. Given the unique absorption characteristics of each layer, such was a logical a pathway towards achieving successful scribes. However, looking towards commercialization, simplification of the process steps would suggest reducing the number of requisite laser sources while also focusing on industrially relevant and prevalent systems supported in large-scale manufacturing.

For the completion of the P1, P2, and P3 laser scribes, various methods have been demonstrated using different laser sources, powers, frequencies, and orientations. Though the overall P1-P3 architecture is considered standard, several key scribing elements are rarely referenced, such as the scribing orientation. FIG. 1B shows the direct and indirect scribing orientations that enable a wide array of potential scribing options. The direct, film-side orientation has been most widely adopted, though recent studies suggest direct scribing-related damage to the perovskite layer has a negative impact on the device performance and stability. Throughout this work, when permitting, indirect scribing methods are adopted to avoid such damage and achieve a higher degree of material removal within the scribes.

In addition to direct and indirect orientations, the material removal mechanism must be carefully and accurately identified. Laser scribing mechanisms typically involve the active ablation of at least one layer within the device, and each scribe involves the removal of a unique set of layers; however, the ablated layer is not always the target layer for that scribe. In most P1 scribes, the front electrode material is ablated to form the P1, thus this is considered an ablative scribe. In many P3 scribes, however, the perovskite absorber material is often targeted as the ablated layer despite the P3 only necessitating the removal of the rear electrode material. Thus, this type of P3 scribe is referred to as a liftoff scribe wherein the specific layer associated with the scribe is lifted off due to the ablation response of an underlying, unrelated layer. The distinction between ablative and liftoff scribes is important for understanding the unique achievements of the scribing mechanism developed in this work.

Thus far, many scribing procedures have incorporated a liftoff P3 mechanism, utilizing a similar procedure as an ablative P2 to focus the ablation on the perovskite absorber material, in this case with the goal of removing the rear electrode as well. Extending this scribing simplification another step, we utilized the liftoff scribing mechanism for the P2 scribe as well, involving the ablation response of only a single layer—the front transparent electrode—to drive the entire P1-P2-P3 scribing process, enabling the use of a single-wavelength, single-mechanism scribing procedure for the full module.

B2) Results and Discussion

Serially interconnected perovskite solar modules were developed following the process flow outlined in FIG. 1C, adapting an inverted planar p-i-n device architecture of soda-lime glass, indium-tin oxide (ITO) front electrode, $NiO_x$ hole transport layer, $Cs_{0.17}FA_{0.83}Pb(I_{0.83}Br_{0.17})_3$ perovskite, $C_{60}$ electron transport layer, bathocuproine (BCP) interlayer, and silver (Ag) rear electrode. Without disruption to any other fabrication step involved in the production of individual cells, three strategically placed laser scribing steps were developed for the electrical isolation of the ITO front electrode (P1), the removal of the perovskite and transport layers for the series interconnection between adjacent cells (P2), and the electrical isolation of the silver rear electrode material (P3). The area containing these three scribes creates an inactive region of the device known as the "dead area" (FIG. 1A), thus mitigation of the requisite dead area was an important consideration for the final module design.

B2.1) Indirect Liftoff Scribing Mechanisms

The basis of the indirect liftoff mechanism employed across the entire perovskite module requires a laser system exclusively tuned to the ablation behavior of the bottom layer in the device stack: the ITO front electrode. A μs-pulsed $Nd:YVO_4$ fiber laser (1064 nm wavelength) is employed due to the ablative response in the ITO front electrode material while ignoring adjacent device layers including the substrate glass and perovskite layers. For P1 scribe ITO ablation, $Nd:YVO_4$ fiber lasers have been widely employed for sufficient electrical disconnection in the front electrode material across a range of industries, the ease of which has been demonstrated across a range of input laser powers. The μs-pulsed $Nd:YVO_4$ fiber laser (1064 nm wavelength) is used to perform ablative P1 scribes and is extended to perform indirect liftoff P2 and P3 scribes, targeting the front TCO exclusively. However, unlike with the common liftoff P3 mechanism, where the underlying perovskite is ablated and removed as part of the process despite not being an essential device feature, the liftoff P2 and P3 scribes utilizing front electrode ablation require that the front electrode material remain intact to allow for the successful series interconnection between adjacent cells, demonstrated in the continuous ITO front electrode film extending from the dead area into the right cell of FIG. 1A—damage or complete removal of this portion of ITO would result in cell disconnection.

Figure 2A:
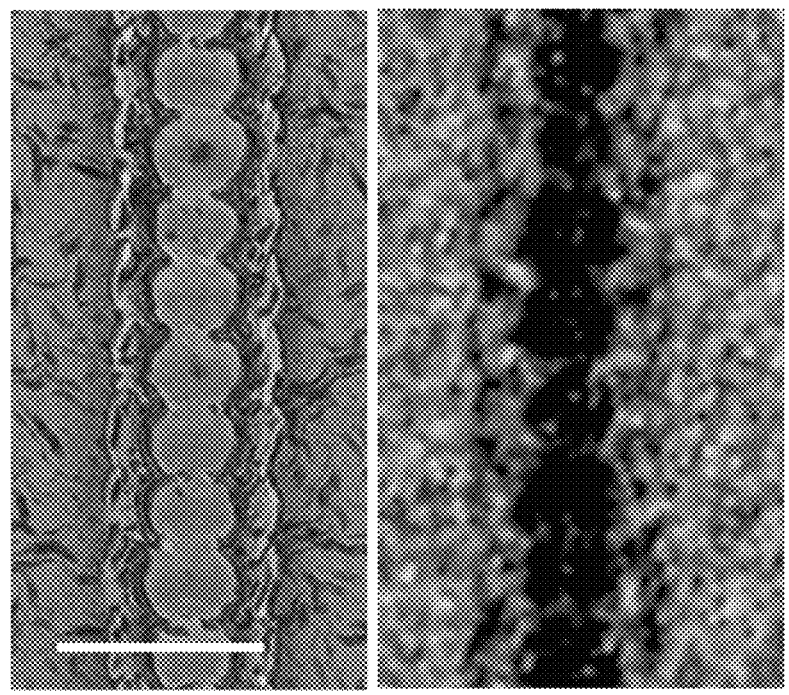
FIGS. 2A-F show geometric characterization results for scribes.
Figure 2B:
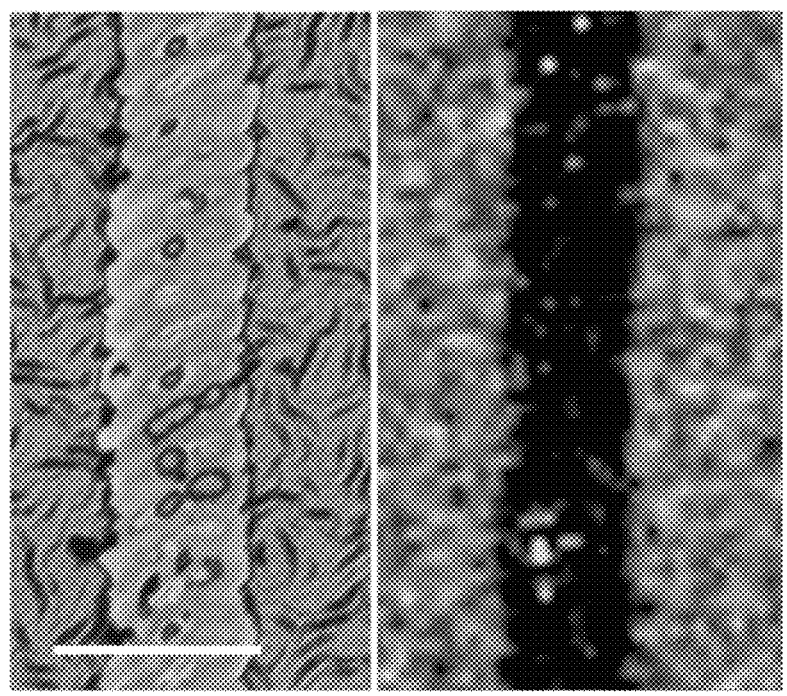
Figure 2C:
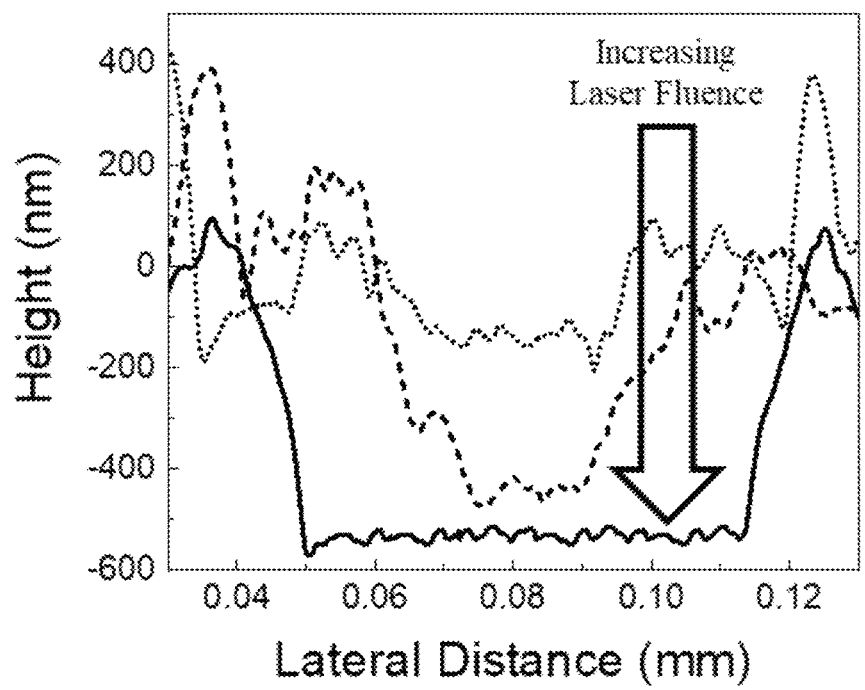
Figure 2D:
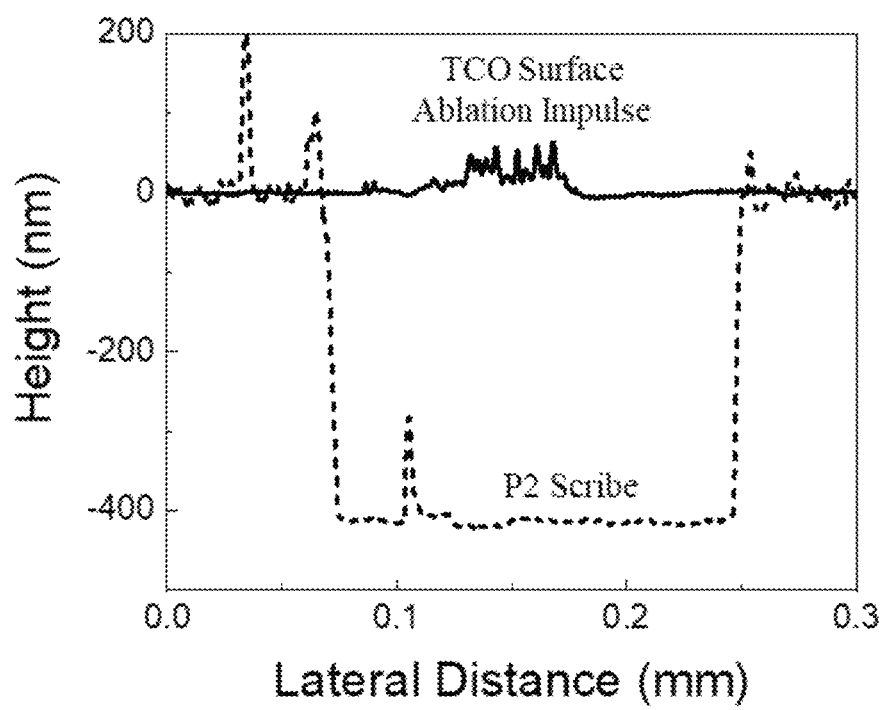
Figure 2E:
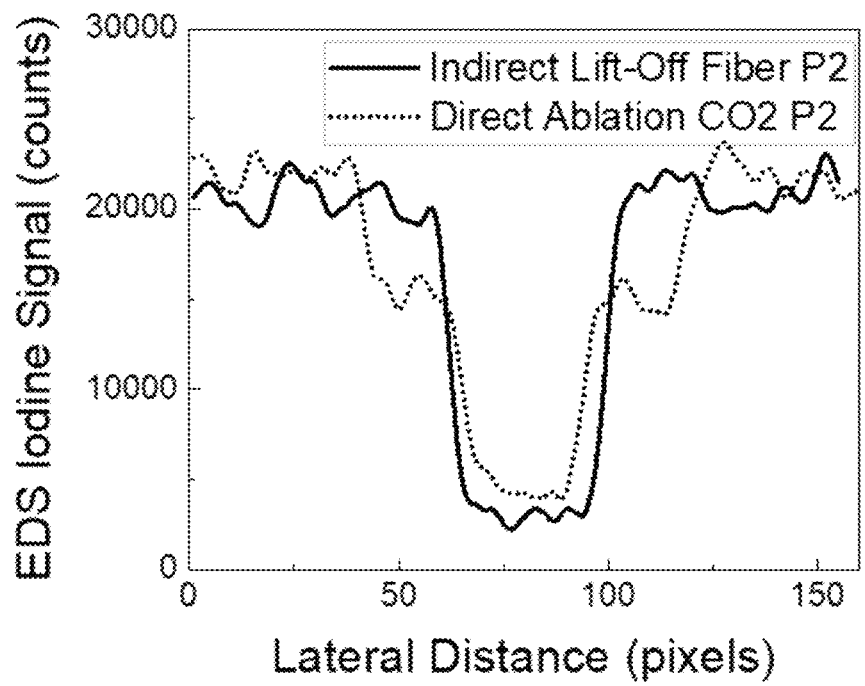
Figure 2F:
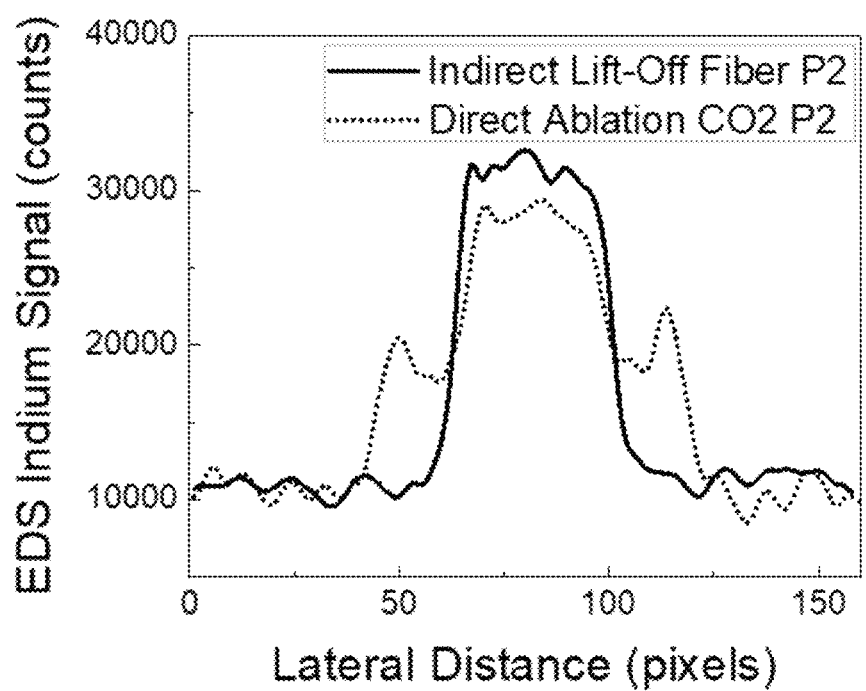

FIG. 2A shows optical microscopy (left) and iodine EDS (energy dispersive spectroscopy) elemental map (right) of direct ablation CO2 laser P2 scribes through active layers. The scale bar is 200 μm. FIG. 2B shows optical microscopy (left) and iodine EDS elemental map (right) of indirect lift-off fiber laser P2 scribes through active layers. FIG. 2C shows contact profilometry scans of direct ablation P2 scribes at varying laser fluences. Optimized scribe profile is shown by the solid line. FIG. 2D shows contact profilometry scans of indirect lift-off P2 scribe on active layers (dashed line) and bare ITO substrate (solid line). FIG. 2E shows EDS iodine perovskite signal across indirect lift-off (solid line)

and direct ablation (dotted line) P2 scribes. FIG. 2F shows EDS indium ITO signal across indirect lift-off (solid line) and direct ablation (dotted line) P2 scribes.

To adapt the liftoff mechanism such that removal of the front electrode material is mitigated or avoided, an indirect scribing orientation was first adopted. While direct scribing of the ITO front electrode with a fiber laser carved into the film, creating a much narrower current pathway, indirect scribing utilized the full thickness of the cohesive ITO layer to prevent what would otherwise lead to removal of the ITO at the ITO/Glass interface. The result is a disruption of the ITO layer without material removal, demonstrated by the solid line in FIG. 2D. This form of an indirect scribe on the ITO layer without ITO removal is referred to as an ablation impulse: the input energy from the laser source is enough to disrupt the ITO layer and encourage the clean liftoff of the overlying materials, aided by the mechanical fragility of the perovskite layer, supplying the impulse for material removal without the active ablation of the overlying layers or measurable removal of the ITO (FIG. 2D).

Figure 6A:
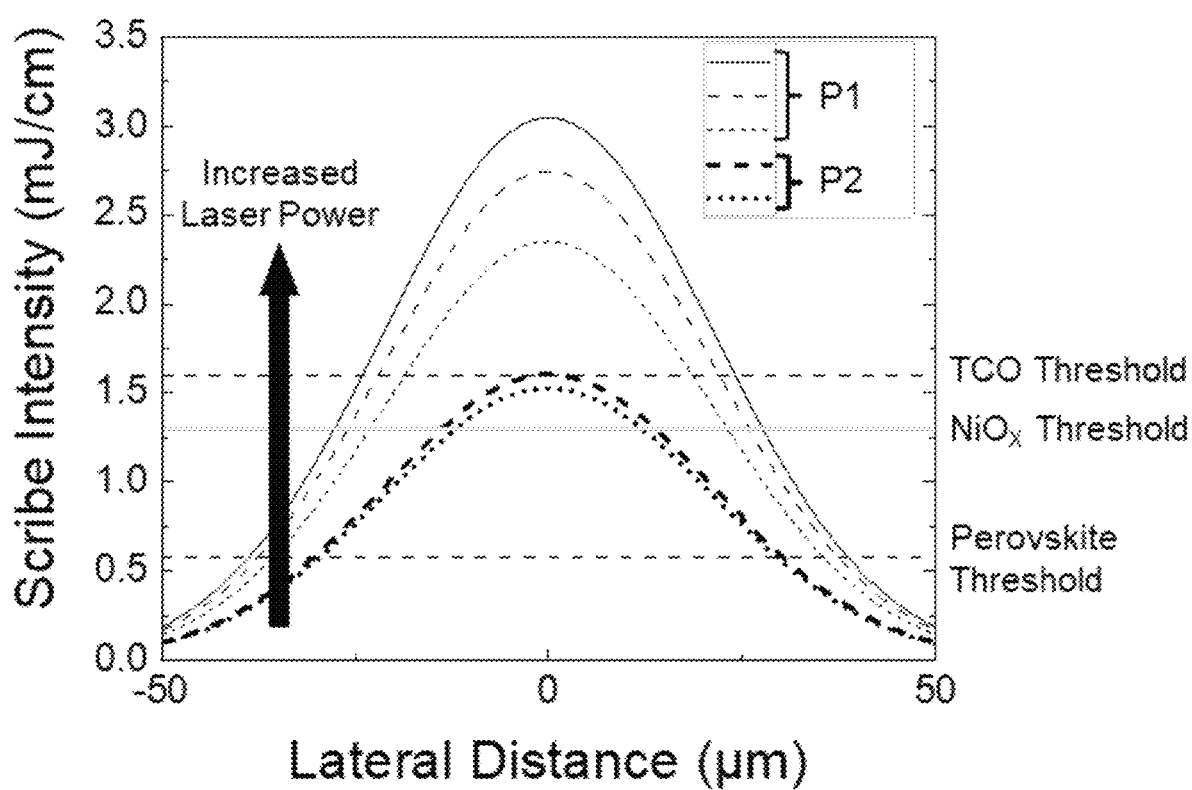
FIG. 6A shows material removal thresholds in relation to laser beam intensity profile.

The ablation impulse is tuned via the input laser fluence to target the removal of the topmost layer(s) of the device stack, providing considerable material selectivity. In the case of the P2 scribe, increasing the laser fluence until material removal is observed first removes exclusively the perovskite layer, maintaining both the ITO and $NiO_x$ layers underneath (FIG. 6A). Further increases in laser fluence approach the $NiO_x$ removal threshold where both the $NiO_x$ and perovskite layers are successfully lifted off the intact ITO until the laser fluence is increased beyond the ITO removal threshold, completely ablating away the ITO within the P2 scribe. Assuming Gaussian laser distribution profiles of the input fiber laser, the laser fluence thresholds for material liftoff and ablation are used to predict the resulting scribe widths with a maximum relative error of 5.4% and an average absolute error of 3% between both P1 and P2 scribes, as shown in the table of FIG. 10.

For the purposes of highlighting the unique character of the TCO-based liftoff method, specifically for P2 scribe application, the characteristics and performance of indirect liftoff scribes were compared to the most adopted P2 method: direct perovskite ablation, in this case utilizing a $CO_2$ laser (10.6 µm wavelength). This contrasting laser source was chosen due to opposing scribing behavior compared to the fiber laser: the fiber laser preferentially scribes through the ITO front electrode without affecting the perovskite, and the $CO_2$ laser only scribes through the perovskite layer without impacting the underlying ITO. The two scribing mechanisms are visually compared in FIGS. 2A-B, and the characteristic ablative P2 profiles of the $CO_2$ laser are observed in FIG. 2C. The SEM-EDS iodine elemental maps in FIGS. 2A-B, used to monitor the presence of the perovskite layer within the P2 scribe suggest superior perovskite removal with the TCO-based liftoff method, additionally supported by the smoother P2 scribe profile in FIG. 2D compared to that of the optimized direct ablation mechanism (FIG. 2C).

Additional characterization of the SEM-EDS scans of the direct perovskite ablation and TCO-based liftoff methods analyzed the intensity across each scribe for both iodine and indium signals, representing the perovskite and underlying ITO, respectively (FIGS. 2E-F). Greater perovskite removal and ITO exposure was expressed in the indirect liftoff fiber scribe profiles throughout the width of the scribes, suggesting superior P2 scribe performance when compared to the direct ablation mechanism. In addition to more effective perovskite removal, the indirect liftoff mechanism avoids an intense thermal load on the perovskite that can extend the ablative behavior beyond the actual scribe width, as evidenced by both indium and iodine EDS profiles of the direct ablation P2 scribe (FIGS. 2E-F). In both cases, an intermediate ablation regime is present on either side of the scribe, almost doubling the width of the effected regime without contributing to a greater contact width. This thermally induced damage from the ablative P2 scribes impacted both the initial performance of the scribes and the stability of the surrounding perovskite, resulting in greater damage to the adjacent perovskite film after 1000 hours aging at 85 C. In contrast, the indirect liftoff scribes showed steeper scribe walls without any superfluous perovskite damage initially nor after thermal aging.

B2.2) Electrical Characterization of Indirect Scribes

Figure 3A:
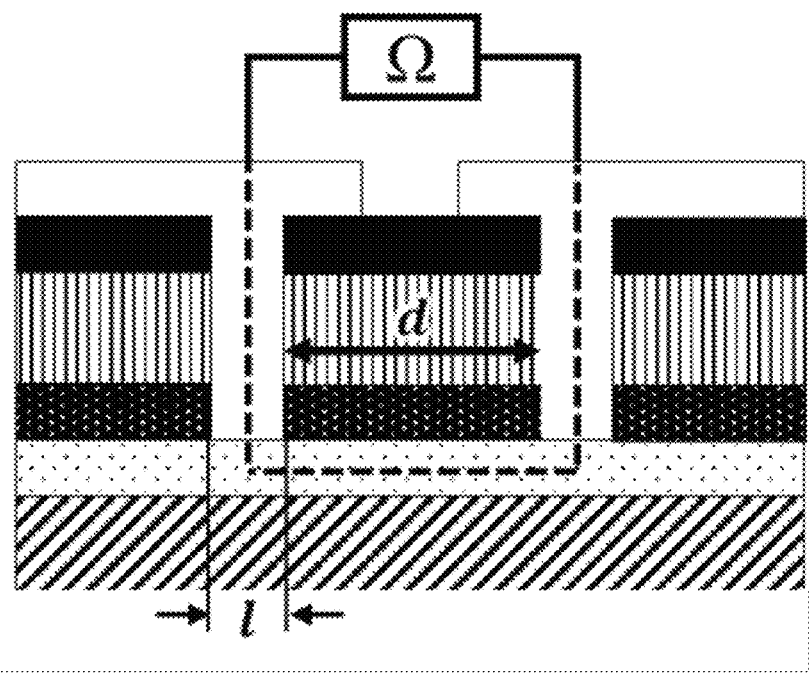
FIGS. 3A-E show electrical characterization results for scribes.
Figure 3B:
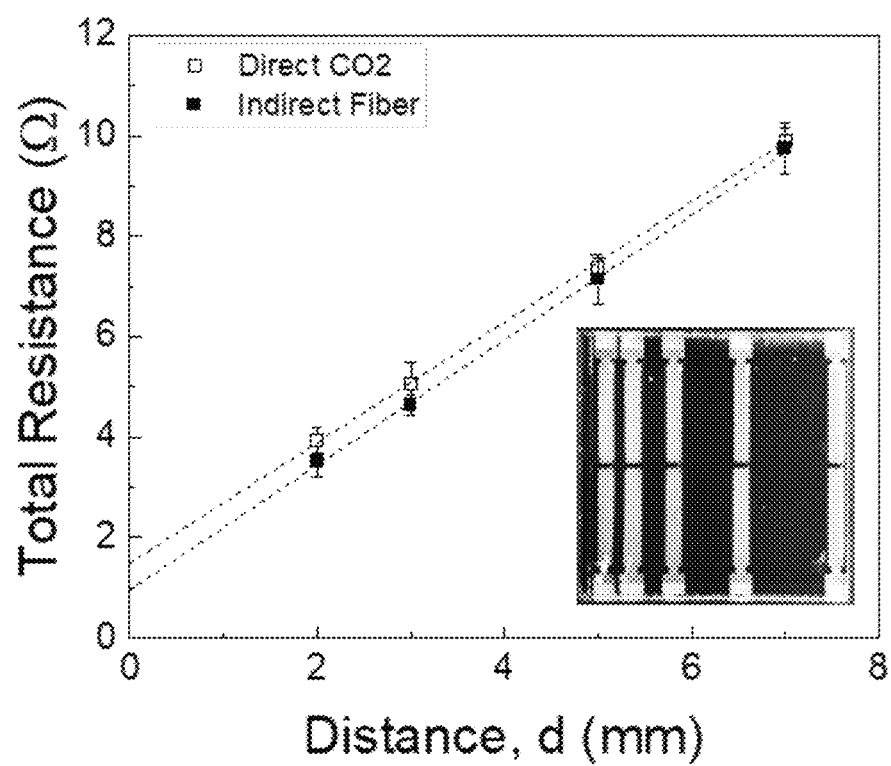
Figure 3C:
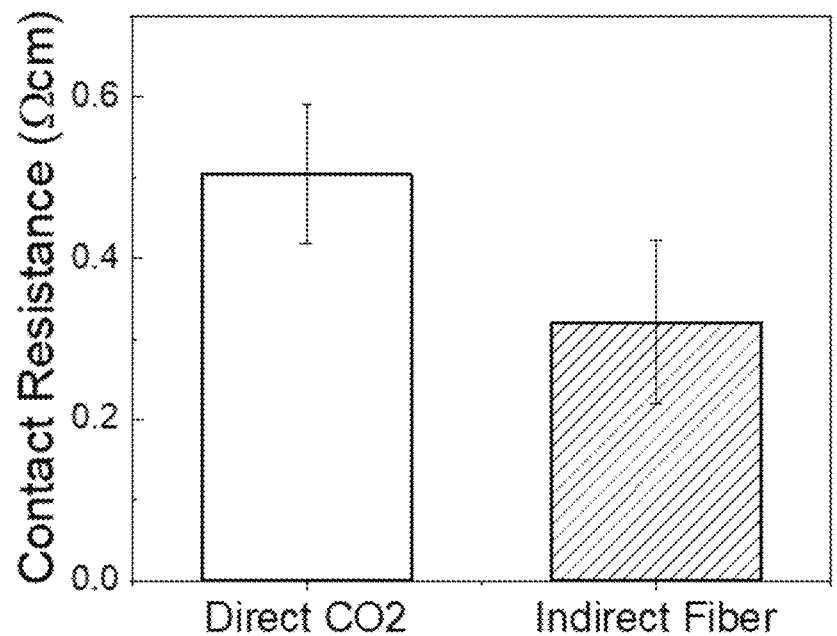
Figure 3D:
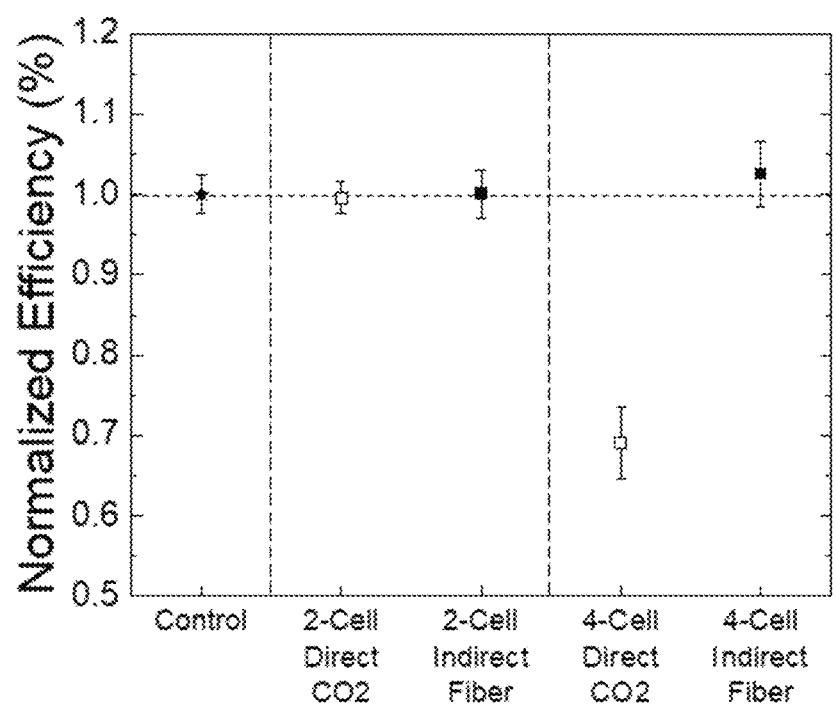
Figure 3E:
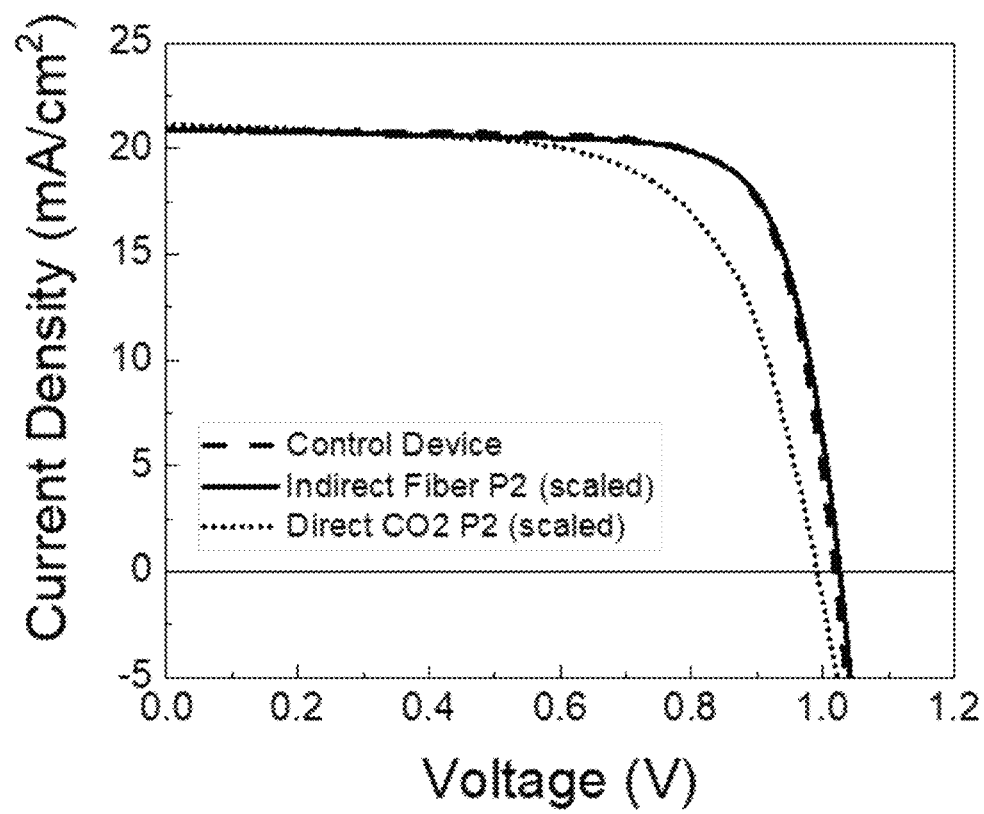
Figure 3F:
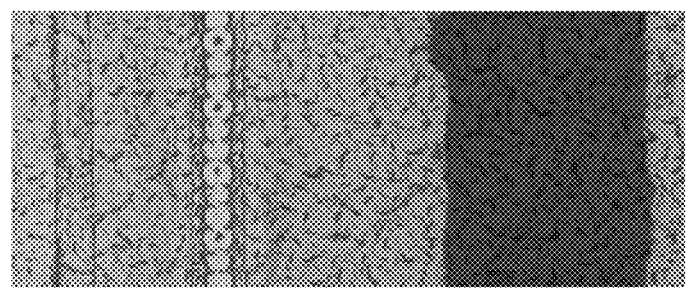
FIGS. 3F-G are images relating to the results of FIGS. 3A-E.
Figure 3G:
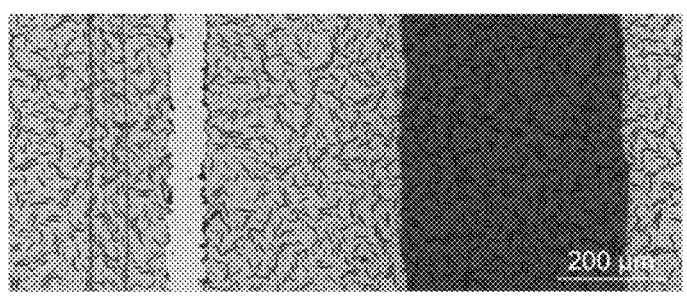

FIG. 3A schematically shows the transmission line model for contact resistance used in this work. FIG. 3B shows transmission line model results for champion P2 scribes. FIG. 3C shows contact resistance results for champion P2 scribes. FIG. 3D shows normalized efficiencies for 2-cell and 4-cell modules with both direct $CO_2$ and indirect fiber P2 laser scribes. FIG. 3E shows 4-cell module J-V curves normalized per cell for comparison with control device. FIGS. 3F-G show optical microscope images of P1-P2-P3 in 4-cell modules.

To evaluate the electrical performance of the direct ablation and indirect liftoff scribes, resistive tests were used following the transmission line model (TLM) for the evaluation of contact resistance. This model, illustrated in FIG. 3A, utilized a test structure having multiple P2 scribes each with an isolated rear electrode contact spaced at increasingly further distances apart. The resistance between adjacent scribes was measured at these varying distances and evaluated using the following formula:

$$R_{TOT} = 2R_M + 2R_C + R_{SH}\frac{d}{w} \quad \text{(Equation 1)}$$

where the total resistance, $R_{TOT}$, is evaluated as a function of the resistances from the metal contacts $R_M$, the contact resistance between the metal and ITO front electrode within the P2 scribes $R_C$, and the sheet resistance of the ITO front electrode $R_{SH}$, whose influence depends on the contact separation, d, and scribe length, w. Relative to the ITO sheet resistance and contact resistance, the metal resistance is negligible, thus the total resistance is a linear function of the contact separation, d, with a y-intercept at $2R_C$.

Further analysis of the contact resistance utilized the following formula:

$$R_C = \frac{\rho_C}{l_T w} \coth\left(\frac{l}{l_t}\right) \approx \frac{\rho_C}{lw} \quad \text{(Equation 2)}$$

where the contact resistance depends on the contact resistivity, $\rho_C$, scribe length, w, scribe width, l, and transfer length, $l_T$. The transfer length refers to the effective scribe width, a result of the semiconducting ITO substrate, though this value is sufficiently large with these scribing mechanisms relative to the scribe width, l, such that Equation 2 was further simplified as shown.

The resulting contact resistances for both the direct ablation P2 scribes and indirect liftoff P2 scribes are shown in the plot in FIG. 3B and the chart in FIG. 3C, demonstrating a reduction in the contact resistance of about 40% when utilizing TCO-based liftoff compared to conventional perovskite ablation despite a decrease in scribe width and contact area (see also the table of FIG. 8). Contact resistivities, following Equation 2, showed an even greater relative decrease for the TCO-based liftoff scribes owing to the narrower scribe profiles of the liftoff mechanism. Such a dramatic decrease in contact resistance resulted from the superior material removal capability of the indirect scribing orientation in addition to unique improvements associated with sourcing the ablation in the underlying ITO layer. Every other P2 scribing mechanism is designed to actively ablate the perovskite layer, commonly resulting in the challenge of removing the underlying transport layer that prevents ideal contact between the rear and front electrodes within the P2. With the TCO-based liftoff mechanism sourced underneath the entire device stack, the liftoff process was capable of consistently removing the transport layer adjacent to the front electrode, creating superior ITO exposure and reducing the resistance of the electrical contact (FIG. 2F).

B2.3) Module Assembly with Indirect Liftoff Scribes

Complete evaluation of the TCO-based liftoff scribing mechanism required analyzing the performance of the resulting indirect liftoff P2 scribes within the context of a serially interconnected module. To isolate the performances of the indirect liftoff and direct ablative P2 scribes, indirect ablative P1 scribes demonstrated previously, alongside P3s using masked evaporation (FIGS. 3F-G), were identically performed for each module, regardless of P2 method. Modules with the ablative and liftoff P2 scribes in both 2-cell and 4-cell configurations were compared to individual cells without any scribing present. In the 2-cell module configuration containing one set of P1-P2-P3 scribes, both the ablative and liftoff P2 scribes performed comparably, showing complete performance retention in reference to the control devices despite the differences in contact resistance and scribe profile between the two P2 methods (FIG. 3D). However, to demonstrate the scribe performance more accurately within a larger module, multiple P2 scribes were needed, thus the introduction of the 4-cell architecture. In this configuration, placing more emphasis on the scribed interconnection performance, the rougher scribe profile and higher contact resistance of the direct ablation P2 scribe resulted in a significant drop in performance of ~30% relative to the control devices; meanwhile, the indirect liftoff P2 module continued to maintain the performance of the referenced control devices with nearly identical J-V curves (FIG. 3E), demonstrating a high-performing P2 scribe alternative to the conventional direct ablation P2 mechanism.

Following the development of the indirect fiber P2 scribe, the same TCO-based liftoff mechanism was slightly altered for compatibility with the P3 scribe in the presence of a rear silver metal electrode. Due to the reflections from the rear metal electrode, the laser fluence for the P3 was lowered to avoid ablation of the ITO front electrode, still resulting in enough of an ablation impulse to remove a continuous line of material for the P3. To ensure high quality P3 performance, a series of tests were performed to evaluate the degree of electrical isolation while monitoring for any potential shunting behavior or ablated ITO. Resistances of several MΩ across the P3 scribe ensured sufficient electrical isolation while scribed half-cell architectures and adapted contact resistance tests demonstrated no shunting behavior and no measurable ITO ablation, respectively.

Figure 4A:
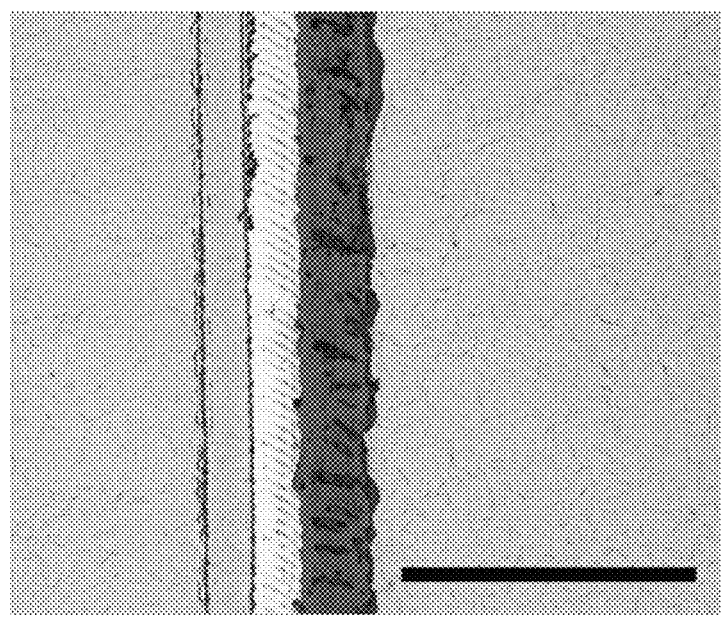
FIG. 4A is an image of fabricated P1, P2, P3 scribes.
Figure 4B:
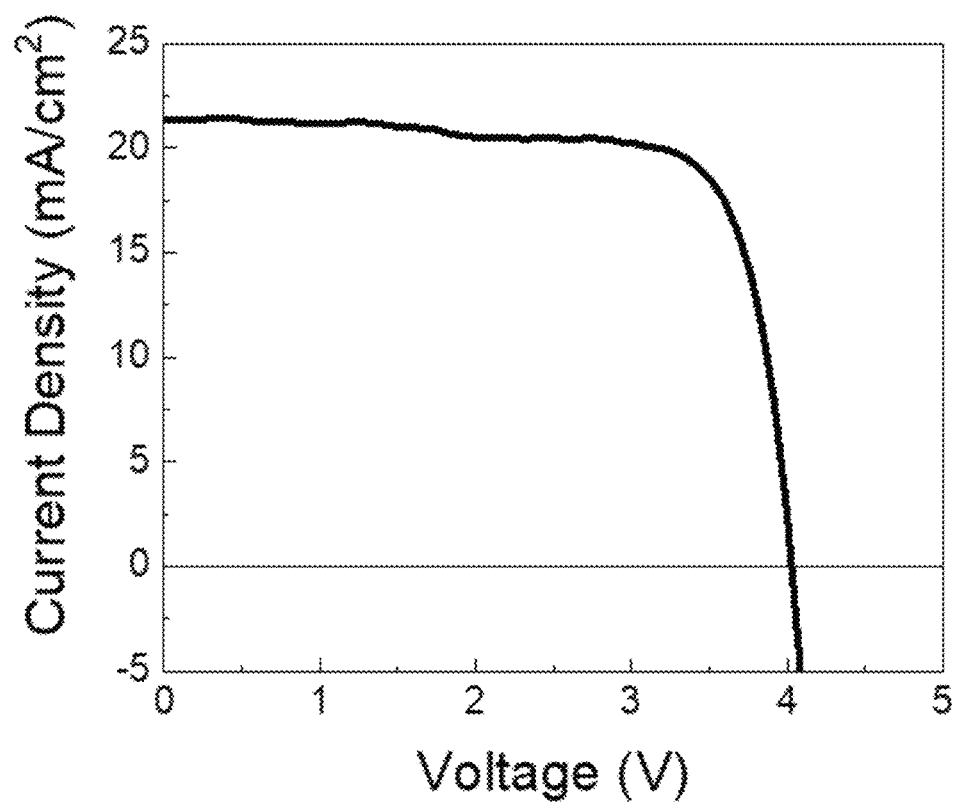
FIGS. 4B-F show solar cell characterization results for solar cells scribed in accordance with this work.
Figure 4C:
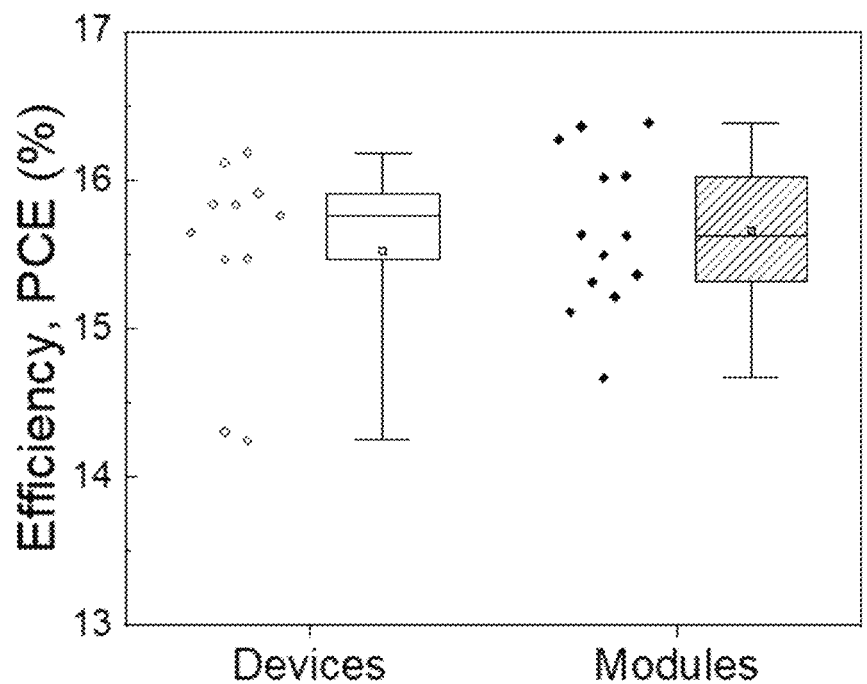
Figure 4D:
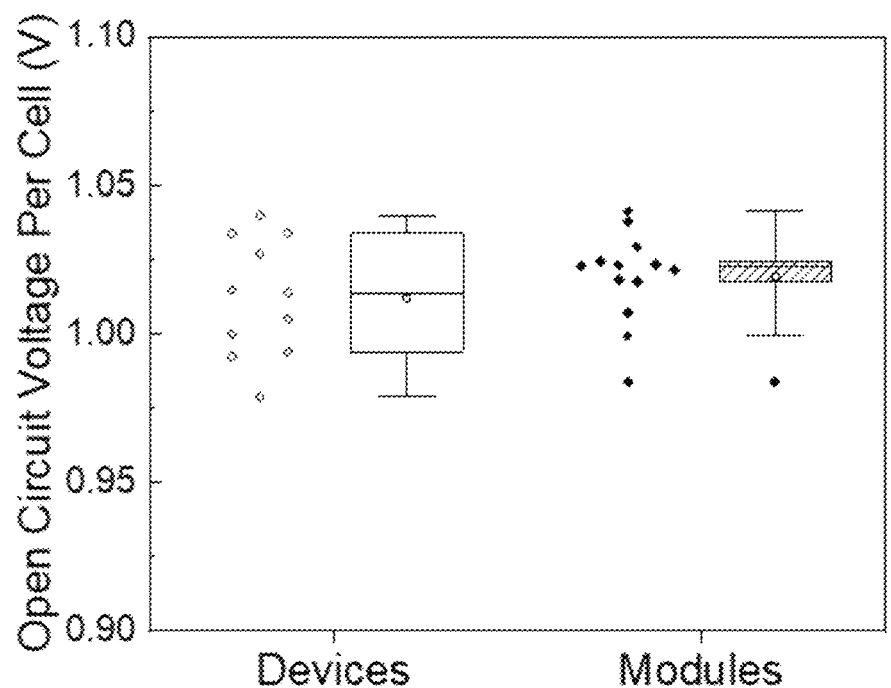
Figure 4E:
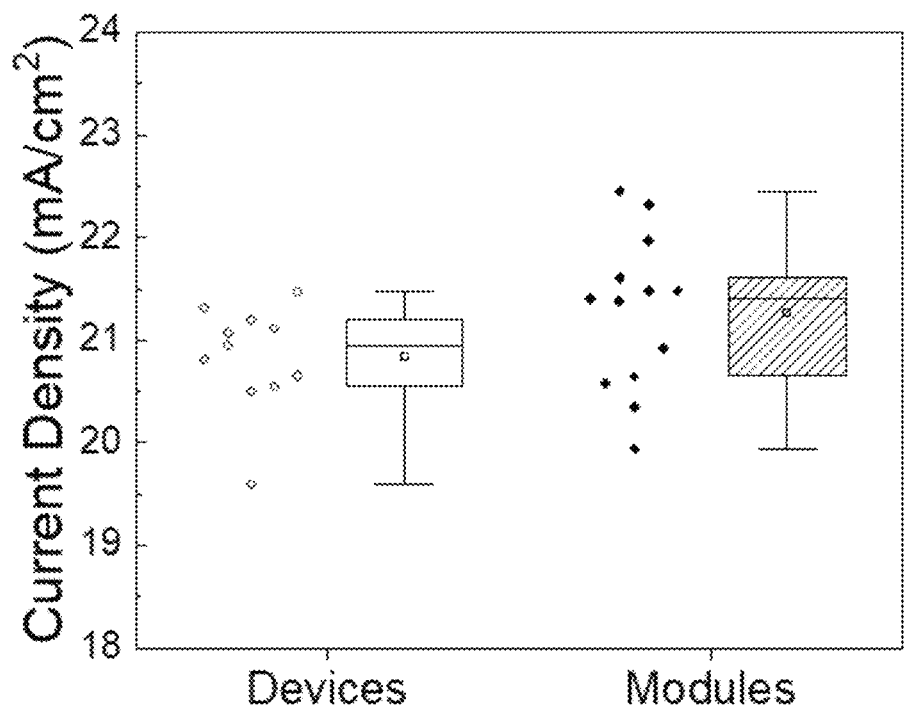
Figure 4F:
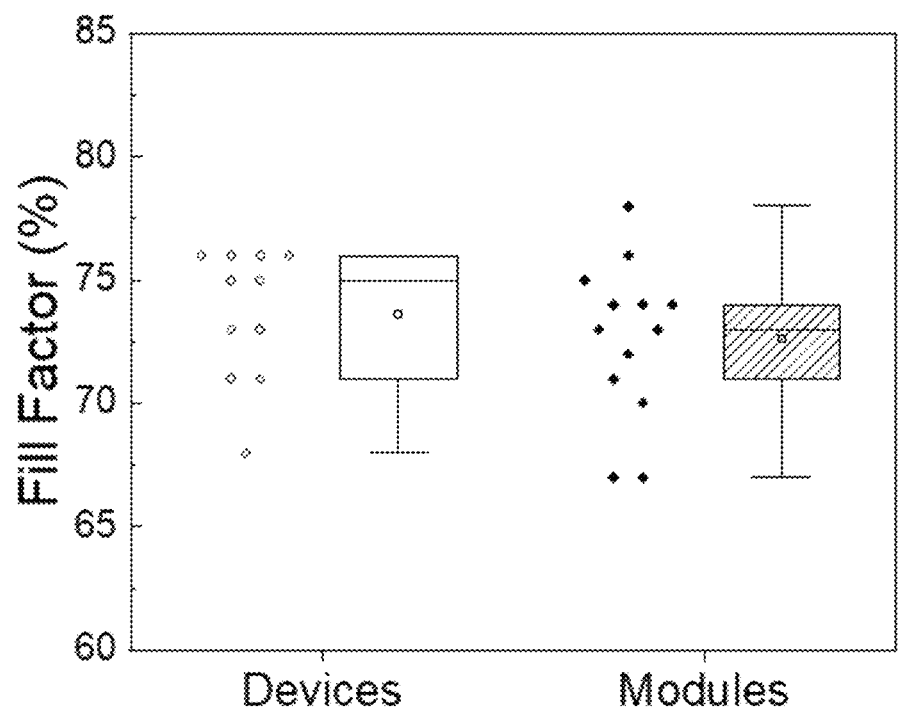

FIG. 4A is an optical microscope image of all three laser scribes with 300 μm dead width. Here the scale bar is 500 μm. FIG. 4B is a J-V curve of a champion 4-cell all-indirect-fiber laser scribed module achieving >16% efficiency. FIGS. 4C, 4D, 4E, 4F show efficiency, open-circuit voltage, short-circuit current density, and fill factor distributions, respectively, of 4-cell modules compared to identically processed single-cell devices.

With the TCO-based indirect liftoff mechanism adapted for the P3 scribe, an all-indirect-fiber module procedure was assembled using an indirect ablation P1, indirect liftoff P2, and indirect liftoff P3 with the same μs-pulsed Nd:YVO$_4$ fiber laser scribing system. The combined dead width for this scribing architecture was 300 μm, which yields a 91% geometric fill factor (GFF) for the 4-cell module architecture with an active area of 0.88 cm$^2$ (FIG. 4A). This all-fiber scribed architecture also successfully maintained the performance of the reference control devices utilizing identically processed device layers despite a >4× increase in active area, achieving an average efficiency of 15.7% compared to an average of 15.5% for the control devices (FIGS. 4B-F, see also the table of FIG. 9). Slight drops in the module fill factor are explained by the much larger total module area compared to the reference control devices where spin-coating inconsistencies played a greater role near the edges of the substrate only sampled by the module design. Meanwhile, a slight increase in current resulted from the improved architecture of the modules placing much less emphasis on the front electrode compared to the control devices, becoming additionally dependent on the P2 scribe performance that demonstrated sufficiently low resistance.

Additional implementation of the indirect liftoff scribes within a slightly different scalable architecture demonstrates the promise of such a method in the transition towards large-area perovskite modules. Rapid Spray Plasma Processed (RSPP) perovskite is used as a means of depositing large-area perovskite films, allowing for the demonstration of 6-, 17-, and 90-cell module configurations up to 27 cm$^2$ in area. Despite a >10× increase in active area between these module configurations, the indirect liftoff scribes enabled remarkably similar performances of 15.5%, 15.2%, and 14.7% for the 6-, 17-, and 90-cell modules, respectively, with a slight drop in fill factor potentially a result of a non-homogeneous spin-coated hole transport layer affecting performance across the 10 cm long modules. These achievements in scalability suggest a reliable pathway towards further scaling up this technology for square-meter-scale perovskite modules.

B2.4) Perovskite Module Manufacturing

Figure 5A:
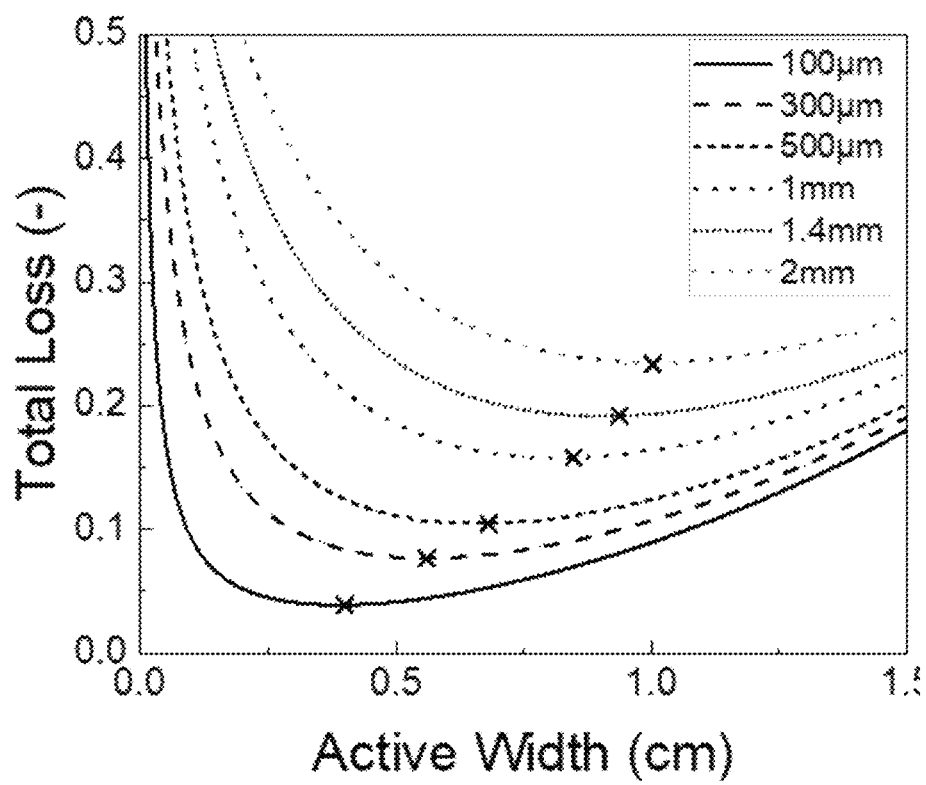
FIG. 5A shows the effect of scribe dead zone width on Total Loss.
Figure 5B:
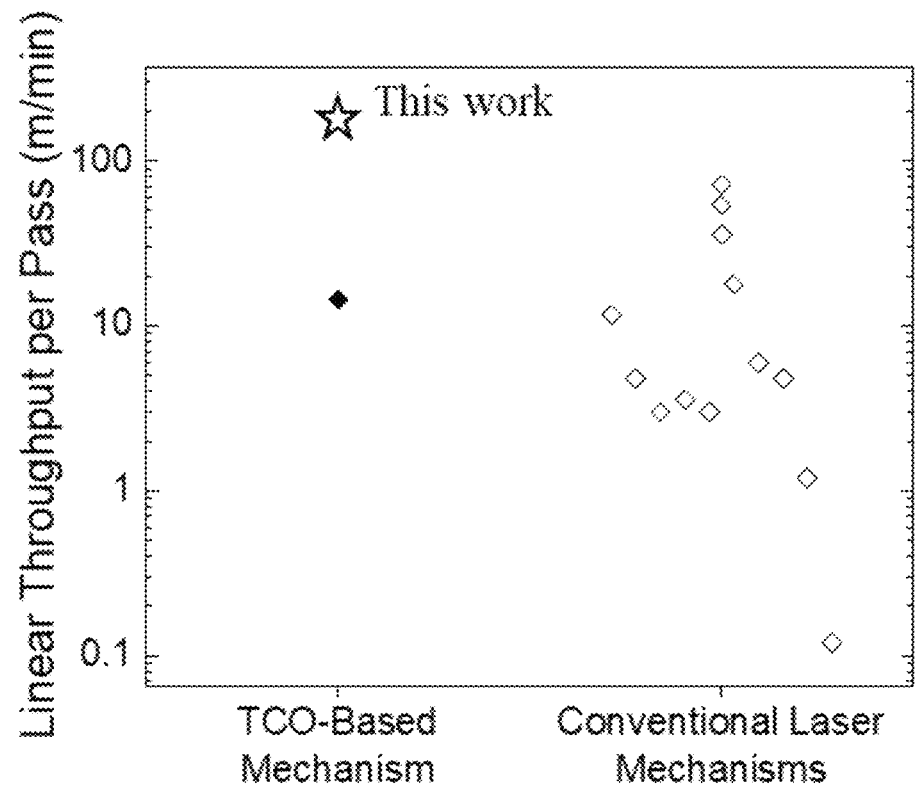
FIG. 5B shows a comparison of throughput provided by this work compared to previous reports.
Figure 5C:
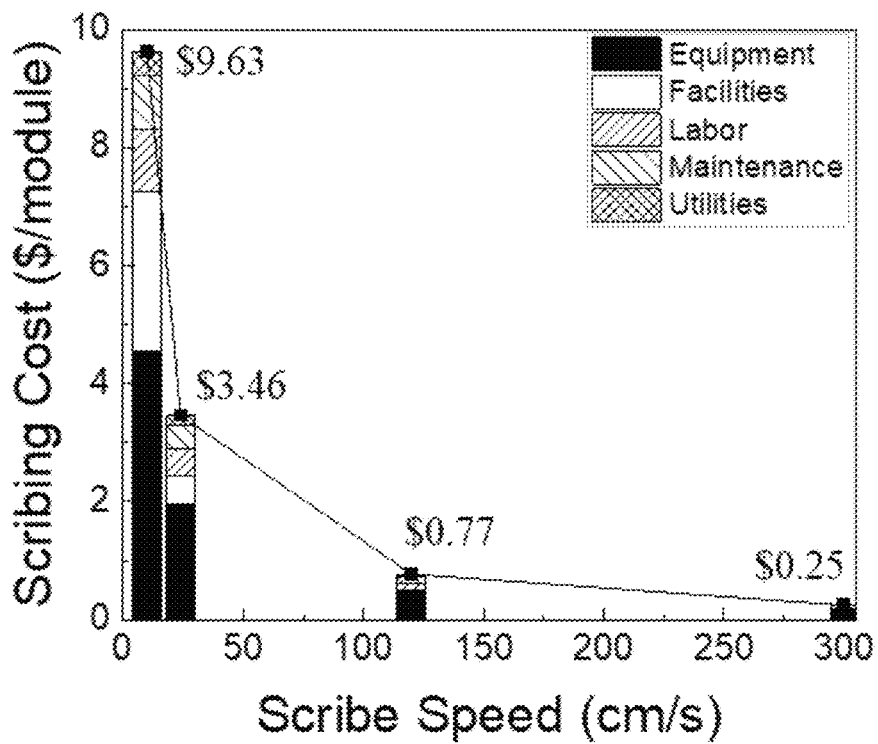
FIG. 5C shows dependence of cost breakdown on scribe speed.
Figure 5D:
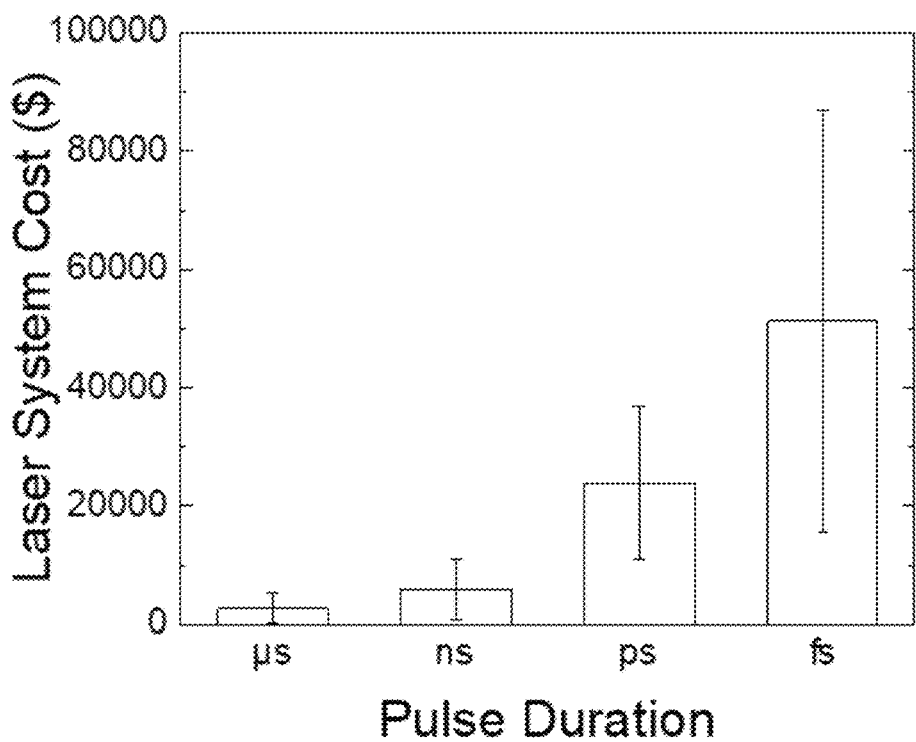
FIG. 5D shows the dependence of laser cost on laser pulse duration.

FIG. 5A shows Total Loss function of modules with varying dead widths from 100 μm to 2 mm. X marks indicate the total loss function minimum for each curve. FIG. 5B shows linear throughput of TCO-based and traditional laser scribing mechanisms from the table of FIG. 7. FIG. 5C shows a cost model of P1-P2-P3 laser scribing with a fiber laser system in a TW scale operation performed at varying scribe speeds: 10, 24, 100, and 300 cm/s. FIG. 5D shows average capital equipment costs of various laser systems as a function of pulse duration regime.

In preparation for scaling perovskite module fabrication towards MW-scale manufacturing, optimized scribing architectures should be considered to improve GFF and ensure compatibility with high-throughput processing. To balance the GFF against resistive elements of the module, namely the front electrode resistance and P2 scribe contact resistance, the total loss function enables analysis of optimized cell widths dependent on the scribed dead width and module resistances. The total loss (TL) function is evaluated as:

$$TL = \left(\frac{W_D}{W_D + W_A}\right) + \left(\frac{W}{W_D + W_A}\right)\left(\frac{J_{MPP}}{V_{MPP}}\right)W_A^2\frac{R_{SH}}{3} + \left(\frac{W_A}{W_D + W_A}\right)\left(\frac{J_{MPP}}{V_{MPP}}\right)W_A L R_C$$ (Equation 3)

where the first term is the dead area portion of the device, the second term evaluates the losses from the front electrode resistance, and the final term incorporates the P2 scribe contact resistance, which can be further evaluated using the transmission line model. With a fixed contact resistance for the TCO-based liftoff mechanism $R_C$, fixed front electrode resistance $R_{SH}$ and device current $J_{MPP}$ and voltage $V_{MPP}$ at the maximum power point, and fixed cell length, L, the total resistive and geometric losses TL can be evaluated as a function of the cell width, $W_A$, while varying the scribed dead area, $W_D$, resulting in the curves in FIG. 5A. For the current scribe geometry involving a 300 μm dead width, the cell width is optimized at 5.6 mm with a GFF of 95%.

Similar modeling was performed on device architectures incorporating metal gridlines to reduce the impact of the front electrode resistance as opposed to the monolithically integrated series interconnections. In addition to processing concerns related to gridlines deposited on the TCO/glass substrate, Total Loss modeling of architectures with gridlines both with and without monolithically integrated scribed series interconnections demonstrated no suitable benefit over the module architecture employed.

When considering implementation of scribing mechanisms in a large-scale perovskite module manufacturing operation, the speed of operation becomes a significant element of production costs. Previous scribing reports have overwhelmingly involved speeds around 1-10 m min$^{-1}$, with maximum speeds found under 100 m min$^{-1}$ (FIG. 5B). In contrast, our scribing operations for the P1, P2, and P3 scribes utilizing the all-fiber 1064 nm laser system are performed at measured speeds of 180 m min$^{-1}$ (300 cm s$^{-1}$) for champion module conditions. In a large-area 1.2 m×2 m perovskite module with the TL-optimized scribing geometry and 12 parallel laser scribing heads, the projected cost of each scribing step at these varying speeds are compared with a cost model factoring in equipment costs, facility leasing and floor space, labor and maintenance, and operating utilities (FIG. 5C). The overall improvement in scribing speed demonstrated in this work enabled a reduction in cost of 68% over the next most competitive scribing speed, a reduction of over 90% from most published scribe speeds.

The improvement in cost, however, is absent any consideration of the differences in capital equipment costs between laser scribing systems. When comparing the different laser sources commonly used for perovskite and thin-film solar module production, fiber laser systems make up a majority (42.3%) of all laser cutting, marking, engraving, and processing systems with $CO_2$ lasers following in a distant second; meanwhile, DPSS and Excimer lasers combined fail to reach the market share of fiber laser systems alone. The vast prevalence of fiber laser systems throughout large-scale manufacturing and in a variety of applications offers the most promise for a manufacturing-scale scribing system for perovskite photovoltaics.

Additionally, for scribing specific applications, the pulse duration is a carefully considered value with most publications opting for ultrashort laser pulses (~fs–ps durations) as opposed to more commonly available and affordable longer pulse duration (~ns–μs durations) equipment. Despite the attractive performance results achieved with ultrashort laser pulses, capable of avoiding damage associated with heat affected zones (HAZ) in direct ablation scribes, equipment costs for these systems are typically an order of magnitude greater than the longer pulse duration counterparts (FIG. 5D). Utilizing the unique TCO-based liftoff mechanism to avoid direct ablation altogether-removing the concern of HAZs in the perovskite layer-enabled the use of longer pulse durations without sacrificing performance, providing a low-cost, high-throughput system well-positioned for the scale-up of perovskite module manufacturing.

B2.5) Further Details

FIG. 6A shows material removal thresholds in relation to laser beam intensity profile.

Figure 6B:
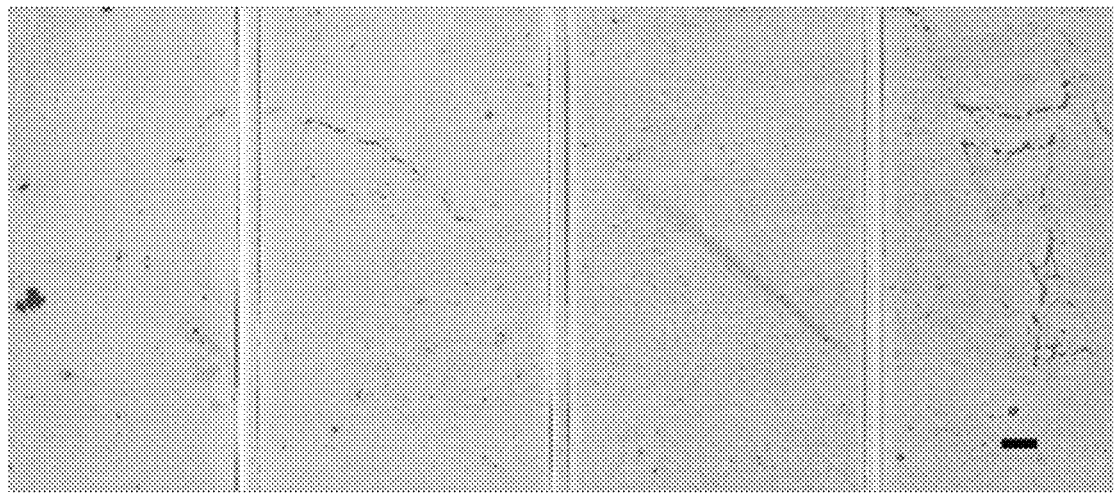
FIGS. 6B-C show images relating to the results of FIG. 6A.
Figure 6C:
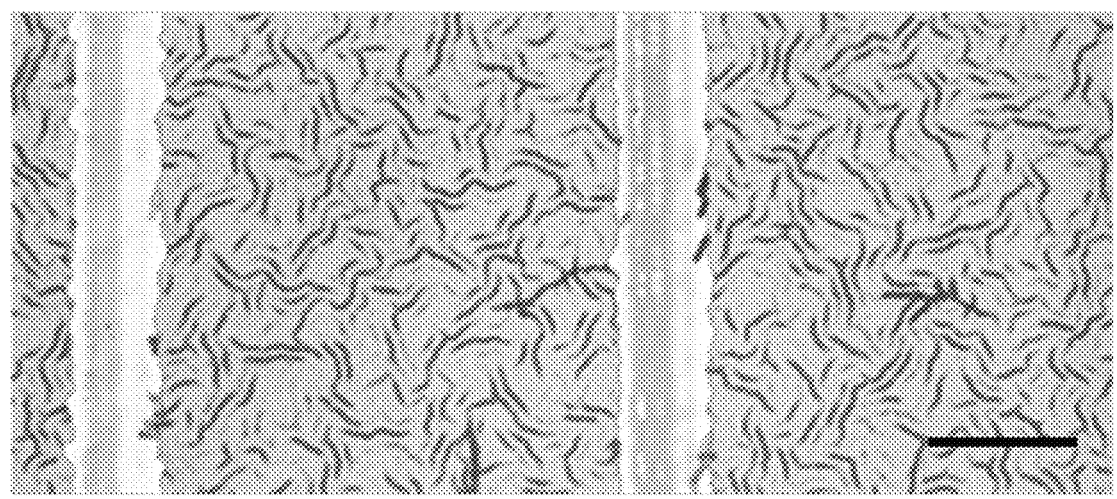

FIGS. 6B-C show P1 and P2 scribes, respectively, at varying laser fluences and scribe widths determined by the profiles in FIG. 6A.

FIG. 7 is a table showing previous scribing methods, comparing laser sources, laser wavelengths, and scribe speeds when reported. Asterisk indicates projected values without demonstration.

FIG. 8 is a table showing electrical performance comparison between direct $CO_2$ and indirect fiber P2 scribes. Scribes are compared to control devices in the 4-cell module configuration.

FIG. 9 is a table showing statistics for the 4-cell all indirect fiber laser-scribed module performance metrics compared to control devices. Module values in parentheses are per cell.

FIG. 10 is a table showing a comparison of actual and predicted scribe widths for various P1 and P2 scribes.

B3) Conclusions

This study introduced new laser scribing terminology to describe the successful development of a unique TCO-based indirect liftoff scribing mechanism utilizing a μs-pulsed fiber laser operating at scribe speeds of 180 m min$^{-1}$. The TCO-based liftoff mechanism avoided thermal damage to the perovskite layer associated with direct ablation mechanisms while enabling superior material removal and front electrode exposure in the P2 scribe, producing serially interconnected modules that maintain >98% of the initial performance of smaller scale devices and modules across various architectures despite 10× increases in active area and greater exposure to film nonuniformities. These indirect liftoff scribes are performed at speeds 2.5× faster than the next fastest scribing speeds published, utilizing the most industrially relevant laser system without costly ultrashort laser pulses, and demonstrating manufacturing-ready, high-throughput, and low-cost P1-P2-P3 scribing processes capable of supporting MW-scale perovskite and thin-film solar module production.

B4) Methods

Precursor Preparation: Sprayable $NiO_x$ used a 20×10$^{-3}$ m solution of $Ni(NO_3)_2$ in deionized (DI) water. The double-cation mixed halide perovskite solution was prepared in an inert nitrogen glove box by dissolving PbI (0.378 g) (TCI), PbBr (0.103 g) (TCI), formamidinium iodide (0.157 g) (Sigma), and CsI (0.049 g) (Sigma) in a 4:1 by volume mixture of 4:1 N,N-dimethylformamide (DMF) and dimethylsulfoxide (DMSO) (1 mL). Anhydrous DMF and DMSO were obtained from Sigma Aldrich. The perovskite solution was heated at 60° C. and stirred for 1 h to dissolve the precursors and was used within one week of mixing.

Perovskite Solar Cell Fabrication: ITO substrates (2 cm×2 cm, 5 cm×5 cm, and 10 cm×10 cm substrate areas, 10 $\Omega sq^{-1}$, Xin Yan Technology, Ltd.) were cleaned by sequential sonication in an alkaline detergent (Extran), acetone, and isopropyl alcohol for 15 min each, followed by a 20 min UV-ozone treatment at 25 mW $cm^{-2}$ (Jelight Model 42). $NiO_x$ was spray-deposited according to a recipe reported in the literature. The perovskite layer was deposited via spin coating in a glove box using the anti-solvent method. 20 μL of perovskite precursor was spread on the substrate and spin coated in a two-step process with 12 s at 1000 rpm, followed by 30 s at 6000 rpm. With five seconds remaining in the second spin step, 80 μL of Chlorobenzene (Sigma Aldrich) was quickly deposited on the spinning substrate before transferring the substrate to a hot plate at 100° C. to be annealed for 30 min. RSPP perovskite for the 6-, 17-, and 90-cell modules were prepared according to a procedure reported in the literature. The cells were completed by evaporating an electron-transporting layer consisting of a 40 nm layer of $C_{60}$ followed by a 7.5 nm layer of bathocuproine (Sigma Aldrich) and a 150 nm thick Ag metal electrode.

Perovskite Module Fabrication: Identical process steps from the cell fabrication methods were adopted for the module fabrication along with the introduction of three scribing steps. An Epilog fusion M2 laser (812 mm×508 mm) bed, dual 50 W source gantry laser system was used for both the $CO_2$ (10.6 μm wavelength) and fiber ($Nd:YVO_4$ optical fiber, 1064 nm wavelength) scribes. Prior to cleaning the ITO substrates, the P1 was performed using the fiber laser at an indirect orientation, a speed of 300 cm $s^{-1}$, and laser operating conditions of 35 W, 1.8 μs pulse duration, and 0.28 MHz pulse frequency. Following the substrate cleaning and active layer depositions up through the bathocuproine, the $CO_2$ direct P2s were performed in a direct orientation at a speed of 24 cm $s^{-1}$ and laser operating conditions of 4 W, 44 μs pulse width, and 11.34 kHz pulse frequency. The fiber lift-off P2s were performed in an indirect orientation at a speed of 300 cm $s^{-1}$ and laser operating conditions of 21 W, 1.8 μs pulse duration, and 0.28 MHz pulse frequency. Following the deposition of the Ag rear metal electrode, the P3 was performed using the fiber laser at an indirect orientation at a speed of 300 cm $s^{-1}$ and laser operating conditions of 11 W, 1.8 μs pulse duration, and 0.28 MHz pulse frequency.

Contact Resistance Measurements: Contact Resistance measurements were performed on samples designed for the transmission line model (TLM) using the same procedures as in module preparation, only altering the scribe and masked Ag metal evaporation design. Measurements were made with a Keithley Model 2400 digital multimeter using the 2-probe ohmmeter setting. Resistance measurements were taken between neighboring contact pads at distances of 2, 3, 5, and 7 mm.

Optoelectronic Characterization: The perovskite cells were measured in ambient conditions (≈45% RH, 25° C.) under 1 sun, AM 1.5G illumination from a 300 W xenon lamp (Oriel PV) solar simulator. The lamp intensity was calibrated based on an NREL-calibrated KG5 filtered Si reference cell. J-V curves were collected with a Keithley Model 2400 digital multimeter measured between −0.1 and 1.4 V for the control devices with an increment of 0.01 V and a delay of 0.1 s between points. For the spin-coated modules, the voltage ranged from −0.1 and 4.8 V with an increment of 0.04 V and a delay of 0.1 s between points. For the RSPP modules, the voltage ranged from −0.1 and 20 V with an increment of 0.2 V and a delay of 0.1 s between points.

Technoeconomic Analysis: The cost-of-ownership model is derived from a bottom-up model that assumes the same p-i-n device architecture monolithically integrated with 1064 nm laser scribing for the P1, P2, and P3. Materials, tool pricing, and equipment/facilities were modeled with Californian labor and utility rates for each tool to produce module dimensions of 1.23 m width by 2 m length scribed into 200 subcells. Each of the scribing processes (P1, P2, and P3) was performed with a 12-laser-head engraving system and scribing was assumed along the length of the module. The costs were calculated within a system operating at a continuous production speed of 306 modules $h^{-1}$ for a 1 TW production line.

The invention claimed is:

1. A method for scribing an electrical or optoelectronic device, the method comprising:
   depositing a transparent conductive oxide (TCO) layer on a transparent substrate;
   depositing one or more active device layers on top of the TCO layer to make a multilayer stack; and
   lifting off at least one layer of the multilayer stack in a liftoff pattern with a vertically selective liftoff;
   wherein the liftoff pattern is defined by passing a laser beam through the substrate to be absorbed in the TCO layer and scanning a position of the laser beam such that material at or above illuminated parts of the TCO layer is lifted off;
   wherein the vertically selective liftoff entails removal of a selected layer of the multilayer stack and all layers in the multilayer stack above the selected layer;
   wherein the selected layer of the multilayer stack is determined by one or more processing parameters of the vertically selective liftoff.

2. The method of claim 1, wherein a fluence of the laser beam in operation is between 0.2 and 1.5 $J/mm^2$ with a pulse duration between 0.1 and 500 μs.

3. The method of claim 1, wherein the TCO layer in the liftoff pattern remain intact after the vertically selective liftoff.

4. The method of claim 1, wherein the multilayer stack includes two or more active device layers, and wherein the selected layer of the multilayer stack is one of the two or more active device layers in the multilayer stack.

5. The method of claim 1, wherein a laser source for the laser beam is a fixed-wavelength fiber laser.

6. The method of claim 1, wherein a scanning speed of the laser beam is at least 100 m/minute.

7. The method of claim 1, wherein the TCO is selected from the group consisting of: indium tin oxide, fluorine-doped tin oxide, aluminum-doped zinc oxide, and transparent oxides that absorb at 1064 nm.

8. The method of claim 1, wherein the one or more active device layers are selected from the group consisting of: dense metal oxides, polymer layers, organic layers, perovskites, hybrid organic-inorganic perovskites, and metal layers.

9. The method of claim 1, wherein the one or more active device layers can each individually be amorphous or crystalline.

10. The method of claim 1, wherein the one or more active device layers each have a corresponding thickness between 10 nm and 1000 nm.

* * * * *